United States Patent
Tanaka

(10) Patent No.: US 7,046,558 B2
(45) Date of Patent: May 16, 2006

(54) METHOD FOR CONTROLLING A NONVOLATILE MEMORY

(75) Inventor: Yoshiyuki Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/227,516

(22) Filed: Sep. 16, 2005

(65) Prior Publication Data

US 2006/0007751 A1    Jan. 12, 2006

Related U.S. Application Data

(63) Continuation of application No. 10/621,451, filed on Jul. 18, 2003, now Pat. No. 7,006,383.

(30) Foreign Application Priority Data

Feb. 4, 2003  (JP) ............................... 2003-27314

(51) Int. Cl.
  *G11C 16/04*  (2006.01)
(52) U.S. Cl. .......................... 365/185.29; 365/185.11; 365/185.12
(58) Field of Classification Search .......... 365/185.29, 365/185.11, 185.09, 185.12
See application file for complete search history.

(56) References Cited

U.S. PATENT DOCUMENTS

| 5,293,337 A | 3/1994 | Aritome et al. |
| 6,058,047 A | 5/2000 | Kikuchi |
| 6,091,643 A | 7/2000 | Kawakami |
| 6,240,032 B1 | 5/2001 | Fukumoto |
| 6,654,286 B1 | 11/2003 | Kawakami |
| 6,831,865 B1 | 12/2004 | Chang et al. |

FOREIGN PATENT DOCUMENTS

| JP | 3-295097 | 12/1991 |
| JP | 408124393 A | 5/1996 |
| JP | 8-143398 | 6/1996 |
| JP | 8-153398 | 6/1996 |
| JP | 11-176177 | 7/1999 |

*Primary Examiner*—Richard Elms
*Assistant Examiner*—Hien Nguyen
(74) *Attorney, Agent, or Firm*—Oblon, Spivak, McClelland, Maier & Neustadt, P.C.

(57) ABSTRACT

A block comprises physical addresses 0, 1, 2, 3. In an initial state, all the physical addresses 0, 1, 2, 3, are in an erase state. When data LA0, LA1, LA2, LA3 are written in the physical addresses 0, 1, 2, 3, count values are "1", respectively. In this manner, a write/erase operation is performed by a page (physical address) unit, and the count value of the physical address in which the data has been renewed is renewed. Finally, when a total of the count values in the block reaches an allowable value 32, refresh is performed, and states of memory cells in the block are initialized.

20 Claims, 20 Drawing Sheets

| | | Memory cell array | (Column number) |
|---|---|---|---|
| | | 0　　　　　511 512 | 527 |
| Block 0 | Page 0 | Data area (512 Bites) | Redundancy area (16 Bites) |
| | Page 1 | | |
| | Page 31 | NU | |
| Block 1 | Page 0 | | |
| | Page 1 | | |
| | Page 31 | | |
| | | | |
| Block X | Page 0 | | |
| | Page 1 | | |
| | Page 31 | | |

Block A

| Data | Count value |
|------|-------------|
| LA0  | 1           |
| —    | —           |
| —    | —           |
| —    | —           |

(a)

| Data | Count value |
|------|-------------|
| LA0  | 1           |
| —    | —           |
| —    | —           |
| —    | —           |

Buffer block

| Data | Count value |
|------|-------------|
| LA0  | 1           |
| —    | —           |
| —    | —           |
| —    | —           |

(b)

| Data | Count value |
|------|-------------|
| E    | E           |
| —    | —           |
| —    | —           |
| —    | —           |

| Data | Count value |
|------|-------------|
| LA0  | 1           |
| —    | —           |
| —    | —           |
| —    | —           |

(c)

| Data | Count value |
|------|-------------|
| LA0  | 2           |
| —    | —           |
| —    | —           |
| —    | —           |

| Data | Count value |
|------|-------------|
| E    | E           |
| —    | —           |
| —    | —           |
| —    | —           |

METHOD FOR CONTROLLING A NONVOLATILE MEMORY

CROSS-REFERENCE TO RELATED APPLICATIONS

This application is a continuation application of U.S. application Ser. No. 10/621,451, filed on Jul. 18, 2003, now U.S. Pat. No. 7,006,383 and is based upon and claims the benefit of priority from the prior Japanese Patent Application No. 2003-27314, filed Feb. 4, 2003, the entire contents of which are incorporated herein by reference.

BACKGROUND OF THE INVENTION

1. Field of the Invention

The present invention relates to management of the number of write/erase times in a nonvolatile semiconductor memory, and is used especially in a NAND-type flash memory.

2. Description of the Related Art

In recent years, a flash memory card in which a NAND-type flash memory is used has been used as storage mediums such as various portable information terminal including a digital camera. FIGS. 1 and 2 show outlines of a memory cell arrangement of the NAND-type flash memory.

A memory cell array of the NAND-type flash memory is constituted of a set of basic units, referred to as a NAND unit NU. The NAND unit NU is constituted of a cell row including a plurality of series-connected memory cells M0, M1, ... M31, and two select gate transistors ST1, ST2 which are connected to opposite ends of the cell row.

In the NAND unit NU, two memory cells disposed adjacent to each other share one source/drain region. Moreover, the select gate transistor ST1 is connected to a bit line BL, and the select gate transistor ST2 is connected to a source line SL.

The memory cell array is divided by a unit of page or block. The page means the set of the memory cells connected to one word line. The page is a basic unit in performing operations such as write, erase, read. The block means a set of pages held between the select gate transistor ST1 on a bit line side and the select gate transistor ST2 on a source line side.

According to an example of FIG. 1, the memory cell array is constituted of X+1 blocks, and one block is constituted of 32 pages. A data length of one page is 528 bytes. Among these bytes, 512 bytes correspond to a data area which can freely be used by a user (user data portion), and the remaining 16 bytes correspond to a redundancy area. In general, in the redundancy area, an error correction circuit (ECC) code for error correction with respect to the data area, logical address, flag indicating whether the block is right or wrong, and the like are stored.

In this NAND-type flash memory, usually, data is erased by the unit of block (block erase). In this case, in data write/erase by a unit smaller than the block, that is, by the unit of page, cell data in the block including the page which is an object of write/erase is temporarily saved into a data storage portion such as another block, and the cell data of the page which is not the object of write/erase has to be protected.

Therefore, in enhancement of a write/erase function of the NAND-type flash memory, there are problems that this save operation requires much time.

To solve the problem, in recent years, a NAND-type flash memory has been developed in which the data can be erased by the page unit (e.g., see Documents 1, 2, 3).

Document 1: Jpn. Pat. Appln. KOKAI Publication No. 3-295097

Document 2: Jpn. Pat. Appln. KOKAI Publication No. 8-143398

Document 3: Jpn. Pat. Appln. KOKAI Publication No. 11-176177

In data erase (page erase) by the page unit, in one selected block, only the cell data of the page which is the object of write/erase may be erased. Therefore, it is not necessary to save the cell data of the page which is not the object of write/erase into another data storage portion.

However, the NAND-type flash memory including a page erase function has the following problem in reliability.

A write/erase operation is repeatedly performed only with respect to one specific page in one selected block. In this case, a voltage stress (intermediate voltage) is repeatedly applied to the memory cell of the page which is not the object of write/erase.

For example, every time data write is executed, the intermediate voltage smaller than a write voltage is applied to the memory cell of the page which is not the object of write/erase.

As a result, a threshold state of the memory cell of the page which is not the object of write/erase in one selected block gradually fluctuates. This finally results in destruction of the cell data. From this, it has heretofore been difficult to use the page erase function, for example, so as to increase a write/erase rate of file data.

As described above, a technique effective for realizing the enhancement of the write/erase function of the nonvolatile semiconductor memory has not heretofore existed.

Therefore, there has been a demand for development of a nonvolatile semiconductor memory in which the page erase function can be used to enhance the write/erase function of the data and which can avoid problems caused by the voltage stress applied to the memory cell of the page not forming the object of write/erase.

BRIEF SUMMARY OF THE INVENTION

According to an aspect of the present invention, there is provided a nonvolatile semiconductor memory in which one block is constituted of a plurality of pages and data is written/erased by a page unit or smaller unit and which comprises a control circuit to manage information associated with the number of data write/erase times with respect to each of the plurality of pages for each page.

BRIEF DESCRIPTION OF THE SEVERAL VIEWS OF THE DRAWING

FIG. 14 is a diagram showing Example 3 of the count operation according to Embodiments 3, 4;

DETAILED DESCRIPTION OF THE INVENTION

A nonvolatile semiconductor memory according to examples of the present invention will be described hereinafter in detail with reference to the drawings.

1. Outline

The example of the present invention is applied to a NAND-type flash memory which includes a page erase function. That is, in the NAND-type flash memory according to the example of the present invention, the page erase function is used to enhance a write/erase capability of data. Moreover, a problem of a voltage stress caused by the page erase function is solved by managing the number of data write/erase times of a page in one block for each page. A concrete example will be described later in each embodiment.

The example of the present invention is applied, for example, to a system in which small-sized data is frequently written/erased (e.g., write/erase of file allocation table (FAT) information). This is because the page erase function mainly enhances the capability with respect to the write/erase of the small-sized data. The example of the present invention is applied to a flash memory card or electronic apparatus in which the card is used.

2. Example of NAND-Type Flash Memory

To describe the example of the present invention, first an example of the NAND-type flash memory, which is an assumption, will be described.

Figures 1, 2:
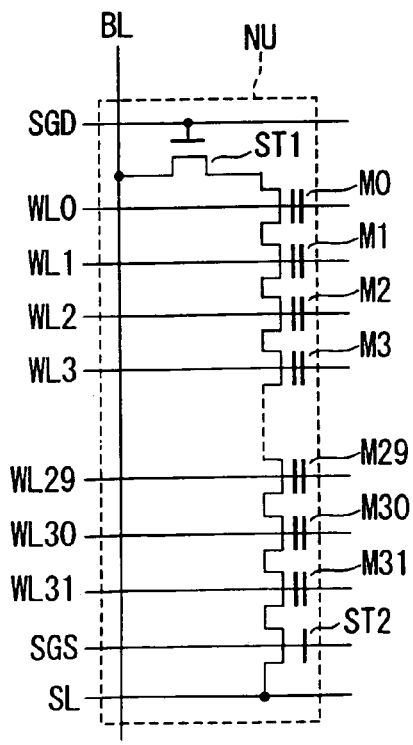
FIG. 1 is a diagram showing a constitution example of a prior-art memory cell array.
FIG. 2 is a diagram showing an example of a NAND cell unit.

FIGS. 1 and 2 show the example of a memory cell array of the NAND-type flash memory.

The memory cell array of the NAND-type flash memory is constituted of a set of basic units, referred to as a NAND unit NU. The NAND unit NU is constituted of a cell row including a plurality of series-connected memory cells M0, M1, . . . M31, and two select gate transistors ST1, ST2 which are connected to opposite ends of the cell row, respectively.

In the NAND unit NU, two memory cells disposed adjacent to each other share one source/drain region. Moreover, the select gate transistor ST1 is connected to a bit line BL, and the select gate transistor ST2 is connected to a source line SL.

The memory cell array is segmented by a unit of page or block. The page means the set of the memory cells connected to one word line. The page is a basic unit in performing operations such as write, erase, read. The block means a set of pages held between the select gate transistor ST1 on a bit line side and the select gate transistor ST2 on a source line side.

According to the example of FIG. 1, the memory cell array is constituted of X+1 blocks, and one block is constituted of 32 pages. A data length of one page is 528 bytes. Among these, 512 bytes correspond to a data area which can freely be used by a user (user data portion), and the remaining 16 bytes correspond to a redundancy area. In general, in the redundancy area, an error correction circuit (ECC) code for error correction with respect to the data area, logic address, flag indicating whether the block is right or wrong, and the like are stored.

The NAND-type flash memory, to which the example of the present invention is applied, includes a page erase function. In this case, to write/erase data by a unit smaller than the block, for example, by the unit of page, in principle, cell data in the block including the page which is an object of write/erase does not have to be temporarily saved into a data storage portion such as another block. Therefore, a data write/erase rate can be increased.

Here, potential relations at a page erase time and at a subsequent write time will be described.

It is assumed that, for example, the cell data of page 0 in block 1 of FIG. 1 is erased at the page erase time. In this case, a word line WL0 (FIG. 2) in the block 1 is set to a ground level (0 V), and other word lines WL1, WL2, . . . WL31 (FIG. 2) in the block 1 and well in the block 1 are set to high potentials (e.g., 20 V). It is to be noted that the well is disposed in each block, and the word line and well in a non-selected block are set to the ground level.

As a result, a large potential difference is generated only between the word line WL0 and well, and the cell data only of the memory cell connected to the word line WL0, that is, the memory cell in the page 0 is erased.

When a plurality of pages are simultaneously erased, the page erase can similarly be performed. That is, the potential of the word line corresponding to the page which is an object to be erased may be set to the ground level, and the other word lines may be set to the high potentials. For example, when the cell data of pages 0 to 2 in the block 1 is erased, the ground level may be given to the word lines WL0 to WL2 of FIG. 2, and the high potential may be given to the other word lines WL3, . . . WL31 and wells of FIG. 2.

In this manner, in a page erase operation, in the same block, only the cell data of one or a plurality of selected pages is erased, and the cell data of the non-selected page is protected as it is without being erased.

A write operation is executed for each page after the page erase.

For example, it is assumed that the write operation is executed with respect to the page 0 in the block 1 of FIG. 1. In this case, the word line WL0 in the block 1 (FIG. 2) is set to the high potential (e.g., 20 V), and the other word lines WL1, WL2, . . . WL31 in the block 1 (FIG. 2) are set to the intermediate potential (the potential between the ground level and high potential, for example, about 10 V). Moreover, the well in the block 1 is set to the ground level (e.g., 0 V).

As a result, the large potential difference is generated only between the word line WL0 and well, and the data is written only in the memory cell connected to the word line WL0, that is, only the memory cell in the page 0 in accordance with the potential level of the bit line.

In this manner, in the write operation, in the selected block, the data is written only in one selected page. At this time, the voltage stress is applied to the memory cells of the remaining non-selected pages.

3. Simplification

Figure 3:
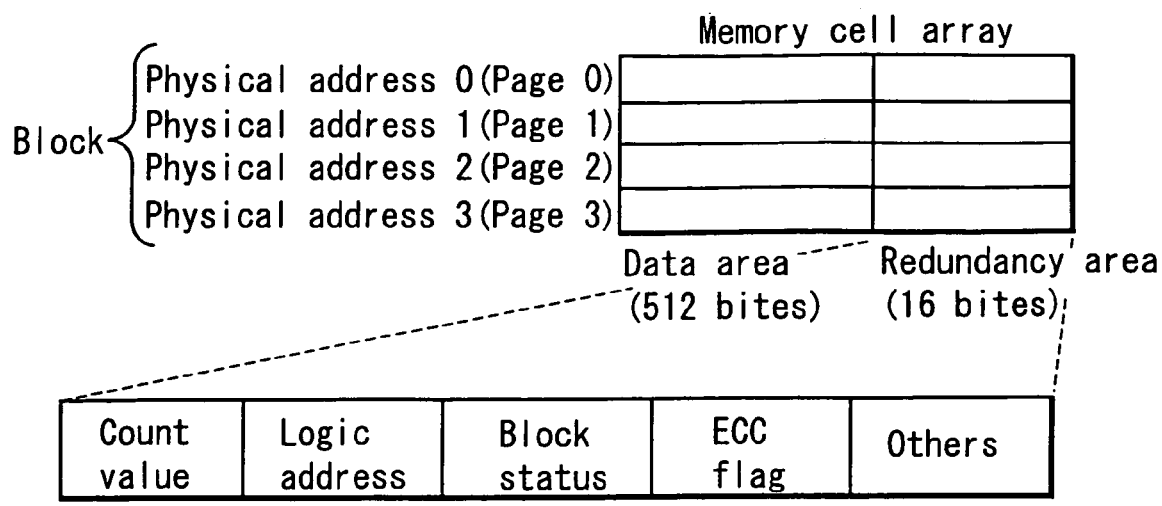
FIG. 3 is a diagram showing data segments of the memory cell array according to an embodiment of the present invention.

The NAND-type flash memory to which the example of the present invention is applied has been described, but in embodiments described hereinafter, to simplify the description, as shown in FIG. 3, it is assumed that one block is constituted of four pages.

Moreover, in the example of the present invention, as described above, the problem of the voltage stress caused by the page erase function is solved by managing the number of data write/erase times of the page in one block for each page. This number of data write/erase times is stored as a count value in a redundancy area of the memory cell array for each page as shown in FIG. 3.

In the example of the present invention, this count value is important, and the other data to be stored in the redundancy area, such as the logic address, flag indicating whether the block is right or wrong (block status), and ECC code, is the same as that of the prior art. Therefore, in the embodiments described hereinafter, with respect to the redundancy area, for the simplified description, the number of data write/erase times, that is, only the count value is described.

Moreover, in the description of the NAND-type flash memory, it has been described that the voltage stress is applied to the memory cell of the non-selected page at the write operation time. Here, without destroying the cell data, a maximum value (allowable value) of the number of times at which the memory cell can bear the voltage stress, that is, the number of data write/erase times which can be experienced by the memory cell in the non-selected page (number of write/erase times) is assumed to be 32 times.

4. Embodiment 1

Embodiment 1 will be described hereinafter.

Characteristics of this embodiment lie in that the number of data write/erase times is managed by the page unit in the NAND-type flash memory including the page erase function. Furthermore, when the number of data write/erase times of each page in one block satisfies a predetermined condition, a refresh operation is performed for one block.

Here, the data may be written/erased by the unit of one page or a plurality of pages or by the block unit. In an important respect, every data write/erase, the number of data write/erase times is counted for each page in which the data write/erase is executed. It is to be noted that a count method is not especially limited as described later.

Moreover, the "refresh operation" described herein means that the data is rewritten with respect to the specific page (all pages or one or more pages) in one block. A meaning or purpose of the refresh operation lies in that the data of the non-selected page is refreshed before destroying the data of the non-selected page by the voltage stress. The meaning or purpose is the same as that of the refresh operation of DRAM. It is to be noted that the method of the refresh operation is not especially limited as described later.

Figure 4:
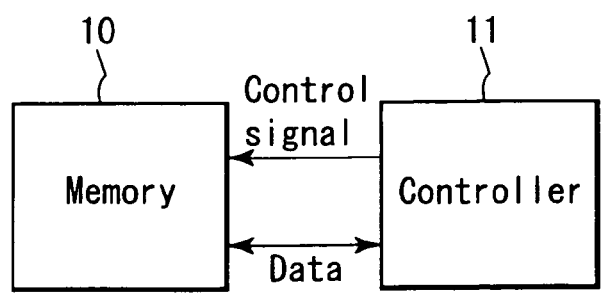
FIG. 4 is a diagram showing an outline of a system according to the embodiment of the present invention.
Figure 5:
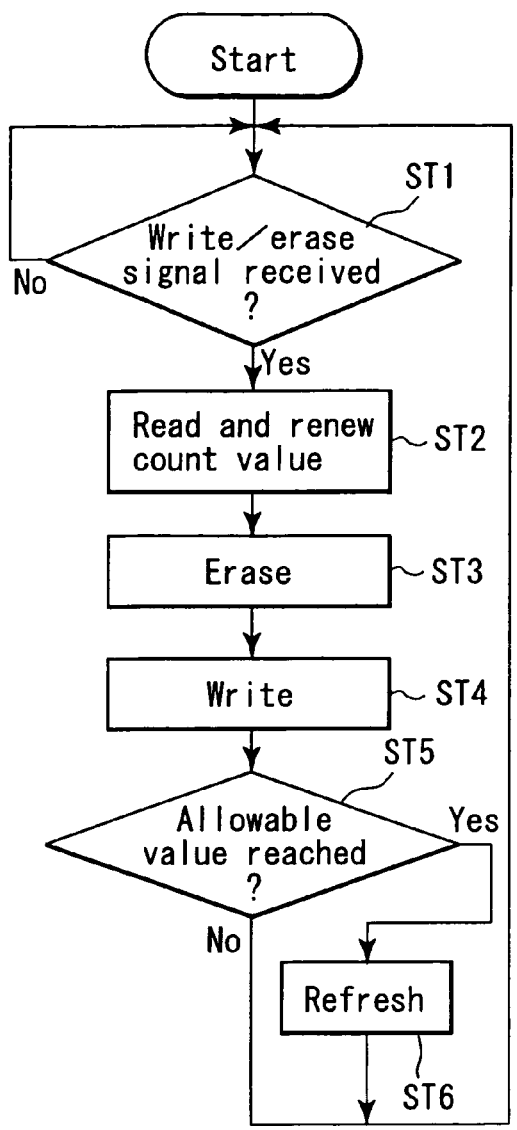
FIG. 5 is a flowchart showing a data renew operation according to Embodiment 1 of the present invention.

FIG. 4 shows a system according to Embodiment 1 of the present invention. FIG. 5 shows a main part of an operation of the system according to Embodiment 1 of the present invention.

A memory 10 is, for example, a NAND flash memory which includes the page erase function. A controller 11 is a control circuit which controls the operation of the memory 10 and which manages the number of data write/erase times for each page.

The memory 10 and controller 11 may be formed in one chip or in separate chips. Moreover, both may be disposed in one apparatus such as a memory card or in separate apparatuses such as the memory card and electronic apparatus.

First, on receiving a write/erase signal from the controller 11, the memory 10 reads the count values of all the pages in the selected block including the page in which the data is to be written/erased (steps ST1 and ST2).

The controller 11 renews the count value with respect to the page in which the data is to be written/erased among all the pages in the selected block. Here, since a way of counting differs with the count method, a term "renew of the count value" is used (step ST2).

Thereafter, the data is erased and written (steps ST3 and ST4).

In the data erase, page erase may be performed in which the data is erased by the page unit, or block or chip erase may also be performed in which the data is erased by the block or chip unit. In short, the memory 10 may include the page erase function of erasing the data by the page unit.

The data is written by the page unit. To write/erase the data with respect to a plurality of or all pages in the selected block, for example, the data is written for each page in order from the memory cell close to the source line. In the data write, new data is stored in the data area, and a new count value is stored in the redundancy area.

Next, the controller 11 judges whether or not the number of data write/erase times reaches the maximum value (allowable value) based on the count value of each page in the selected block (step ST5).

When the number of data write/erase times does not reach the maximum value (allowable value), any operation according to the present invention is not especially performed. That is, the memory 10 performs a usual operation under control of the controller 11.

When the number of data write/erase times reaches the maximum value (allowable value), the controller 11 issues a command to the memory 10 to perform the refresh operation. A method of the refresh operation will be described later in detail. When the refresh operation is performed, in principle, the number of data write/erase times (count value) of each page in the selected block is initialized. Additionally, the number of data write/erase times may not be initialized depending on the counting method in some case (step ST6).

5. Embodiment 2

Embodiment 2 will be described hereinafter.

This embodiment is a modification example of Embodiment 1. In this embodiment, the definition of terms and other conditions in Embodiment 1 are applied as such.

In Embodiment 1, when the number of data write/erase times satisfies the predetermined condition, the refresh operation is performed.

However, in this case, with respect to the page which is the object of the last data write/erase, after the data is erased and written, the refresh operation (erase and write) is continuously executed. That is, the last data write/erase operation is redundant.

Therefore, in this embodiment, the data write/erase operation with respect to the page which is the object of the last data write/erase is performed in the refresh operation. In this case, a useless data write/erase operation can be eliminated, and a data write/erase capability can be enhanced.

Figure 6:
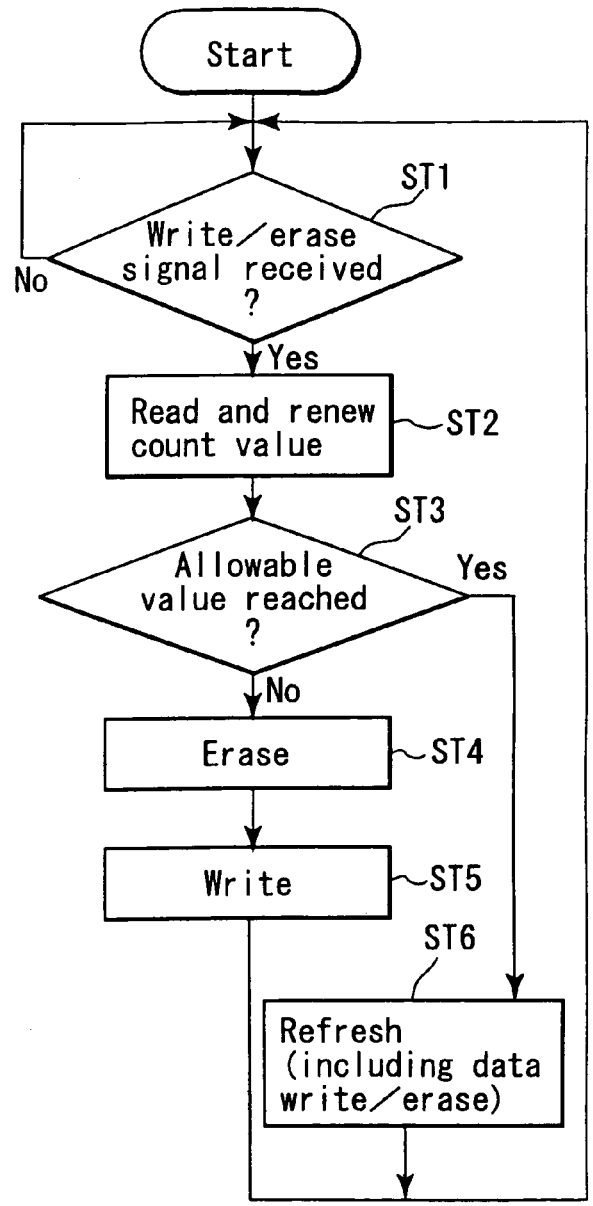
FIG. 6 is a flowchart showing the data renew operation according to Embodiment 2 of the present invention.

FIG. 4 shows the system according to Embodiment 2 of the present invention. FIG. 6 shows the major part of the operation of the system according to Embodiment 2 of the present invention.

Since the memory 10 and controller 11 have been described above in Embodiment 1, the description thereof is omitted here.

First, on receiving the write/erase signal from the controller 11, the memory 10 reads the count values of all the pages in the selected block including the page in which the data is to be written/erased (steps ST1 and ST2).

The controller 11 renews the count value with respect to the page in which the data is to be written/erased among all the pages in the selected block. Since the way of counting differs with the count method as described above, the term "the renew of the count value" is used (step ST2).

Next, the controller 11 judges whether or not the number of data write/erase times reaches the maximum value (allowable value) based on the count value of each page in the selected block (step ST3).

When the number of data write/erase times does not reach the maximum value (allowable value), the data is erased and written (steps ST4 and ST5).

In the data erase, the page erase may be performed in which the data is erased by the page unit, or the block or chip erase may also be performed in which the data is erased by the block or chip unit.

The data is written by the page unit. To write/erase the data with respect to a plurality of or all pages in the selected block, for example, the data is written for each page in order from the memory cell close to the source line. In the data write, the new data is stored in the data area, and the new count value is stored in the redundancy area.

When the number of data write/erase times reaches the maximum value (allowable value), the controller 11 issues the command to the memory 10 to perform the refresh operation (step ST6).

The method of the refresh operation will be described later in detail. In Embodiment 2, with respect to at least the page which is the object of the data write/erase in the selected block, the data is written/erased by this refresh operation. Moreover, with respect to the page which is not the object of the data write/erase in the selected block, the usual refresh operation is executed.

When the refresh operation is performed, in principle, the number of data write/erase times (count value) of each page in the selected block is initialized. Additionally, the number of data write/erase times may not be initialized depending on the counting method in some case.

6. Example of Count Operation According to Embodiments 1, 2

An example of the count operation according to Embodiments 1, 2 will be described hereinafter.

(1) EXAMPLE 1

① Count Method

Figure 7:
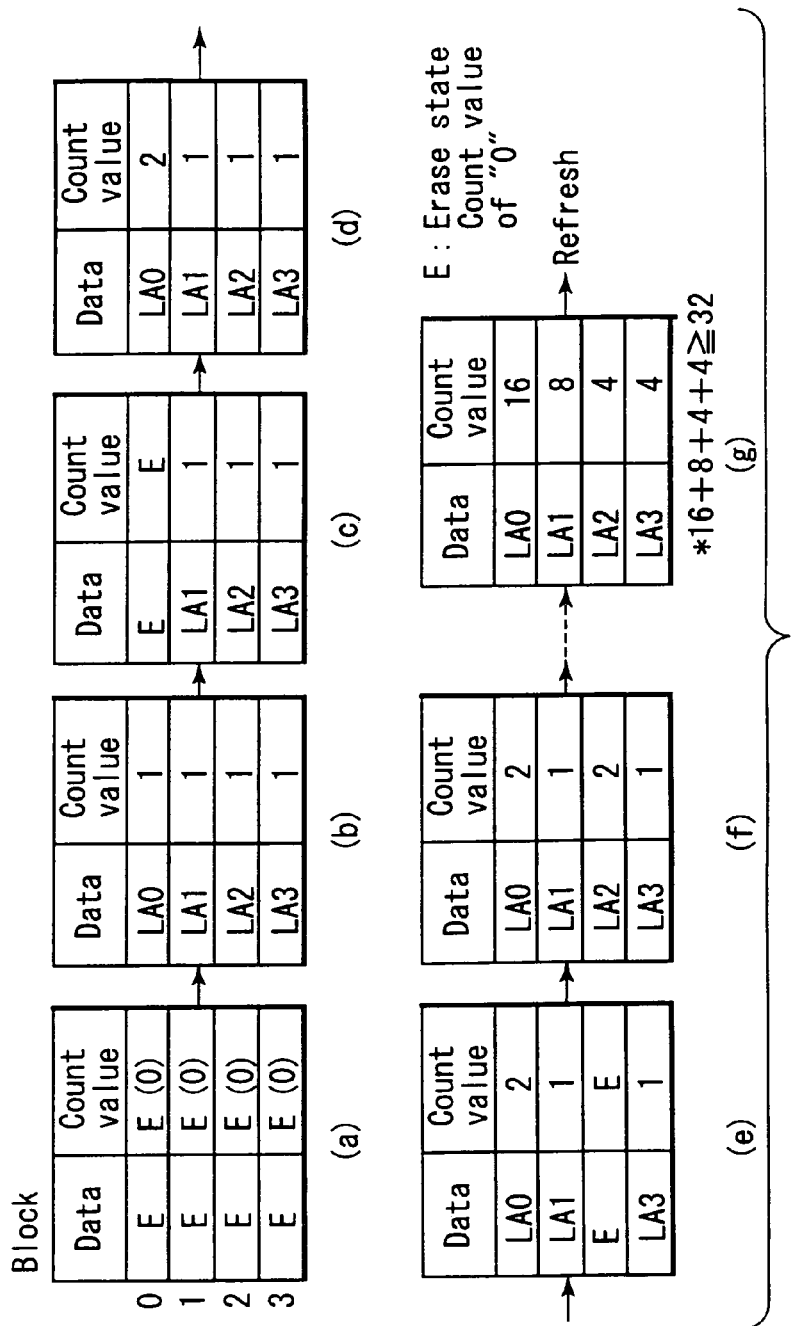
FIG. 7 is a diagram showing Example 1 of a count operation according to Embodiments 1, 2.

FIG. 7 shows the count method according to the example of the present invention.

In the present example, the count value is stored in the redundancy area in the memory cell array of the NAND-type flash memory. The count value indicates the number of data write/erase times with respect to the page, and is stored for each page.

The refresh operation is performed on a condition that the total of count values of the respective pages in the block reaches the maximum value (allowable value) of 32 times. That is, for the data write/erase operation, as a worst case, a case is considered in which at least one page is not selected once. Since the memory cell in the non-selected page can bear the voltage stress caused by 32 data write/erase times, the above-described condition is set.

It is to be noted that in the description of Example 1, physical addresses 0, 1, 2, 3 indicate the memory cells selected by address signals 0, 1, 2, 3, that is, pages 0, 1, 2, 3.

For a reason why the term of the physical addresses 0, 1, 2, 3 is used, it is considered that one page is equal to one physical address, when one bit data is stored in each of a plurality of memory cells connected to one word line one physical address). However, when a plurality of bits are stored (with a multi-valued memory), one page is not equal to one physical address.

Logic addresses 0, 1, 2, 3 indicate the address signals 0, 1, 2, 3.

Moreover, for example, the data stored in the physical address 0 is referred to as "LA0", because the physical address 0 is selected by the logic address 0. It is to be noted that the data is stored in each memory cell regardless of one bit or a multiplicity of bits. For the similar reason, the data stored in the physical addresses 1, 2, 3 are referred to as "LA1", "LA2", "LA3". "E" indicates that the memory cell is in an erase state.

(a) Initial State

The memory cells in all the physical addresses (pages) 0, 1, 2, 3 in the block are in the erase state.

(b) Write

First, the data LA0 is written in the physical address 0, data LA1 is written in the physical address 1, data LA2 is written in the physical address 2, and data LA3 is written in the physical address 3.

At a write time of the data LA0 with respect to the physical address 0, "1" is written as the count value of the physical address 0, that is, the number of data write/erase times in the redundancy area. Similarly, at the write time of the data LA1, 2, 3 with respect to the physical addresses 1, 2, 3, "1" is written as the count values of the physical addresses 1, 2, 3, that is, the number of data write/erase times.

(c) and (d) Data Write/Erase of Physical Address 0

The controller 11 outputs a data renew request of the physical address 0 to the memory 10 (see FIG. 4).

First, the count values of all the physical addresses 0, 1, 2, 3 in the block are read. Moreover, in the controller 11 of FIG. 4, "1" is added to the count value of the physical address 0 which is the object of data write/erase. As a result, the count value of the physical address 0 turns to "2". The count values of the physical addresses 0, 1, 2, 3 are temporarily stored in a memory (RAM, and the like) in the controller 11 of FIG. 4.

Thereafter, the data LA0 and count value stored in the physical address 0 are erased (see (c)). Subsequently, the renewed data LA0 and count value (="2") are written in the physical address 0 (see (d)).

Moreover, in the controller 11 of FIG. 4, the total value of the count values of all the physical addresses 0, 1, 2, 3 is calculated. At this time, since the count value of the physical address 0 is "2", and the count values of the physical addresses 1, 2, 3 are "1", the total value of the count values of all the physical addresses 0, 1, 2, 3 is "5". This total value is smaller than the maximum value (allowable value) of "32".

Therefore, at this time, the refresh operation is not performed.

(e) and (f) Data Write/Erase of Physical Address 2

The controller 11 outputs the data renew request of the physical address 2 to the memory 10 (see FIG. 4).

The count values of all the physical addresses 0, 1, 2, 3 in the block are read. Moreover, in the controller 11 of FIG. 4, "1" is added to the count value of the physical address 2 which is the object of data write/erase. As a result, the count value of the physical address 2 turns to "2". The count values of the physical addresses 0, 1, 2, 3 are temporarily stored in the memory (RAM, and the like) in the controller 11 of FIG. 4.

Thereafter, the data LA2 and count value stored in the physical address 2 are erased (see (e)). Subsequently, the renewed data LA2 and count value (="2") are written in the physical address 2 (see (f)).

Moreover, in the controller 11 of FIG. 4, the total value of the count values of all the physical addresses 0, 1, 2, 3 is calculated. At this time, since the count values of the physical addresses 0, 2 are "2", and the count values of the physical addresses 1, 3 are "1", the total value of the count values of all the physical addresses 0, 1, 2, 3 is "6". This total value is smaller than the maximum value (allowable value) of "32".

Therefore, also at this time, the refresh operation is not performed.

(g) Refresh

Following the data renew request, operations similar to the above-described operations of (c) and (d), or (e) and (f) are executed, and finally the count values of the physical addresses 0, 1, 2, 3 are indicated as in (g).

The controller 11 of FIG. 4 confirms that the total value of the count values of the physical addresses 0, 1, 2, 3 is "32", and gives a command to perform the refresh operation to the memory 10 of FIG. 4.

In the present example, the count values of the physical addresses 0, 1, 2, 3 are all "1" or more. That is, any of the physical addresses 0, 1, 2, 3 is the object of data write/erase at least once among 32 data write/erase operations. Therefore, there is not a physical address which has undergone 32 voltage stresses in a state in which the address is not the object of data write/erase.

However, as described above, as a worst case, a case is considered in which at least one physical address is not selected even once in 32 data write/erase operations. In this case, at least one physical address undergoes 32 voltage stresses in the state in which the address is not the object of data write/erase.

Then, when the total value of the count values of the physical addresses 0, 1, 2, 3 reaches the maximum value (allowable value) of "32", the refresh operation is executed regardless of the count values of the respective physical addresses 0, 1, 2, 3.

It is to be noted that in the present example, in an initial state, all the physical addresses 0, 1, 2, 3 are in the erase state and a data write operation is first performed with respect to all the physical addresses 0, 1, 2, 3 as a first operation. Therefore, in the worst case, the address is not the object of data write/erase even once in second and subsequent operations.

That is, when the data of the memory cell is not destroyed by 32 voltage stresses, the total value of the count values of the physical addresses 0, 1, 2, 3 reaches "33" on a condition of refresh.

In the present example, the condition of refresh is based on the total value of the count values of the physical addresses 0, 1, 2, 3, but this condition is changed in accordance with the initial state of the memory. An important respect lies in that the worst case is assumed and the maximum value (allowable value) is determined based on the worst case.

In the refresh operation, the data stored in the data area is rewritten and thereby refreshed, but the count value of the redundancy area is initialized, for example, in a state of (b) at a refresh operation time. That is, in the write operation in the refresh, the count values "1" are written in the redundancy areas corresponding to the physical addresses 0, 1, 2, 3, respectively.

② Method of Refresh Operation

A method of the refresh operation will be described.

As described above, the refresh comprises: rewriting the data with respect to all the pages or one or more pages in the block. A purpose of refresh lies in that the data of the memory cell is refreshed before the data of the memory cell is destroyed by threshold fluctuation by the voltage stress. Any method may also be used as long as this purpose can be realized.

(a) Example 1 of Refresh

For example, after the data of all the physical addresses in the block to be refreshed is transferred to the memory (RAM, and the like) in the controller, the data of all the physical addresses in the block is erased. This erase may be either the block erase or page erase. Subsequently, the data temporarily stored in the memory in the controller is returned again to the physical address in the block. Accordingly, the data of the memory cell constituting the physical address which is the object of refresh is refreshed.

(b) Example 2 of Refresh

First, after transferring the data of all the physical addresses in one block to be refreshed to another block which is not to be refreshed, the data of all the physical addresses in one block is erased. This erase may be either the block erase or page erase subsequently, the data temporarily stored in the other block is returned again to the physical address in one block. Accordingly, the data of the memory cell constituting the physical address which is the object of refresh is refreshed. In this example, one and the other blocks may be formed in the same chip, or in different chips.

③ Timing of Refresh Operation

A timing to perform the refresh operation is not especially limited.

For example, when the allowable value is "32", the total value of the count values of the physical addresses in the block reaches 32. When a 32nd write/erase operation is finished, the refresh operation may immediately be executed. Moreover, the refresh operation may also be executed in an appropriate timing after ending the 32nd write/erase operation, for example, after access from host stops.

It is to be noted that in Example 2 a 32nd data write/erase operation is performed in the refresh operation. Therefore, when the total value of the count values of the physical addresses in the block reaches 32, the refresh operation is immediately executed together with the 32nd data write/erase operation.

④ Others

In the present example, the count value starts from "0" like 0, 1, 2, . . . , and increases by "1" in accordance with the number of data renew times, but the example of the present invention is not limited to this counting.

For example, an initial value may be a numeric value other than "0", such as "2", or a binary number "10". An increase value may be a numeric value other than "1", such as "2". In this case, the maximum value (allowable value) of the number of data write/erase times also naturally changes. In the present example, the maximum count value is "32", and it is therefore sufficient to secure the number of bits with which the number can be counted up to "32" in the redundancy area of the memory cell array. That is, with respect to one physical address, five bits in the redundancy area are used as an area for storing the count value.

Moreover, the increase value of the count value may not be like an arithmetic progression.

For example, when four bytes, that is, 32 bits in the redundancy area of the memory cell array are used as the area for storing the count value, the number of data write/erase times may also be judged by the number of bits in a "1" state among these 32 bits.

Concretely, the initial value of the count value corresponding to the predetermined physical address is "00000 . . . 000 (32 bits)", and the number of "1" in this area is increased in accordance with the number of data renew times. For example, when the number of data renew times is one, "00000 . . . 001" (the number of "1" is one in 32 bits) is obtained. When the number of data renew times is two, "00000 . . . 011" (the number of "1" is two in 32 bits) is obtained.

Moreover, for example, when four bytes, that is, 32 bits in the redundancy area of the memory cell array are used as the area for storing the count value, the number of data write/erase times may also be judged by a position of the bit in the "1" state among these 32 bits.

Concretely, the initial value of the count value corresponding to the predetermined physical address is set to "00000 . . . 000 (32 bits)", and the position of "1" in this area is changed in accordance with the number of data renew times. For example, when the number of data renew times is one, "00000 . . . 001" (the position of "1" is a right end portion in 32 bits) is obtained. When the number of data renew times increases, the position of "1" is shifted leftwards by one.

Moreover, instead of increasing the count value in accordance with the number of data renew times, the value may also be decreased. For example, the initial value of the count value is set to "32", and this number may also be decreased by one in accordance with the number of data renew times.

(2) EXAMPLE 2

① Count Method

Figure 8:
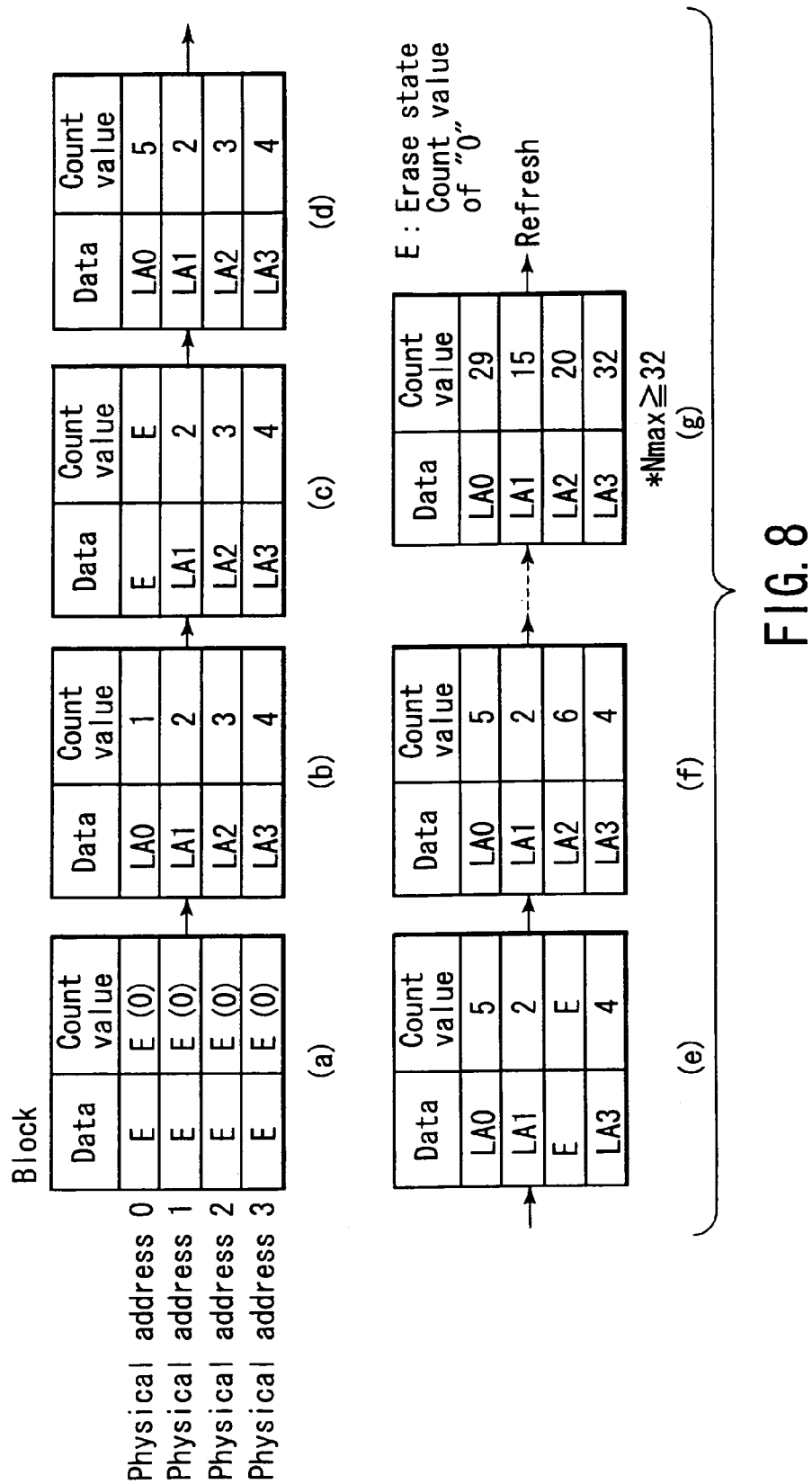
FIG. 8 is a diagram showing Example 2 of the count operation according to Embodiments 1, 2.

FIG. 8 shows the count method according to the example of the present invention.

In Example 1 (FIG. 7) described above, the number of data write/erase times is managed for each page, and the controller calculates the total value of the number of data write/erase times in the block based on the number of data write/erase times for each page.

On the other hand, in Example 2, the total value of the number of data write/erase times in the block is managed. That is, the count value of the page which is the object of data write/erase is set to the total value of the number of data write/erase times in the block including the page, not the number of data write/erase times for the page.

Therefore, the controller may select a maximum value Nmax from the count values of the respective pages in the block every data write/erase.

Moreover, the refresh is performed on a condition that the maximum value Nmax in the count values of the respective pages in the block reaches the allowable value of 32. Because, concerning the data write/erase operation, as the worst case, a case is considered in which at least one page is not selected even once. The memory cell in this non-selected page can bear the voltage stress caused by 32 data write/erase times, and therefore the above-described condition is set.

It is to be noted that also in the description of Example 2, the meaning of the physical addresses 0, 1, 2, 3 and logic addresses 0, 1, 2, 3 is the same as that of Example 1, and the description thereof is therefore omitted. Moreover, since the meaning of LA0, LA1, LA2, LA3, and E is the same as that of Example 1, the description thereof is omitted here.

(a) Initial State

The memory cells in all the physical addresses (pages) 0, 1, 2, 3 in the block are in the erase state.

(b) Write

First, the data LA0 is written in the physical address 0, data LA1 is written in the physical address 1, data LA2 is written in the physical address 2, and data LA3 is written in the physical address 3.

At the write time of the data LA0 with respect to the physical address 0, "1" is written as the count value of the physical address 0, that is, the number of data write/erase times. Moreover, at the write time of the data LA1 with respect to the physical address 1, second data write/erase is performed as seen in the whole block. Therefore, "2" is written as the count value of the physical address 1, that is, the number of data write/erase times.

Similarly, at the write time of the data LA2 with respect to the physical address 2, third data write/erase is performed as seen in the whole block. Therefore, "3" is written as the count value of the physical address 2, that is, the number of data write/erase times. Moreover, at the write time of the data LA3 with respect to the physical address 3, fourth data write/erase is performed as seen in the whole block. Therefore, "4" is written as the count value of the physical address 3, that is, the number of data write/erase times.

(c) and (d) Data Write/Erase of Physical Address 0

The controller 11 outputs the data renew request of the physical address 0 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. At this time, the count value "4" of the physical address 3 has a largest value. The controller 11 of FIG. 4 adds "1" to the count value "4" of the physical address 3, and uses a count value "5" as the count value of the physical address 0 which is the object of data write/erase. The count values of the physical addresses 0, 1, 2, 3 are temporarily stored, for example, in the memory (RAM, and the like) in the controller 11 of FIG. 4.

Thereafter, the data LA0 and count value stored in the physical address 0 are erased (see (c)). Subsequently, the renewed data LA0 and count value (="5") are written in the physical address 0 (see (d)).

Moreover, the controller 11 of FIG. 4 judges whether or not the maximum value Nmax in the count values of the physical addresses 0, 1, 2, 3 reaches "32". At this time, the count value "5" of the physical address 0 is largest, but does not reach the allowable value "32".

Therefore, at this time, the refresh operation is not performed.

(e) and (f) Data Write/Erase of Physical Address 2

The controller 11 outputs the data renew request of the physical address 2 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. At this time, the count value "5" of the physical address 0 has the largest value. The controller 11 of FIG. 4 adds "1" to the count value "5" of the physical address 0, and uses a count value "6" as the count value of the physical address 2 which is the object of data write/erase. The count values of the physical addresses 0, 1, 2, 3 are temporarily stored, for example, in the memory (RAM, and the like) in the controller 11 of FIG. 4.

Thereafter, the data LA2 and count value stored in the physical address 2 are erased (see (e)). Subsequently, the renewed data LA2 and count value (="6") are written in the physical address 2 (see (f)).

Moreover, the controller 11 of FIG. 4 judges whether or not the maximum value Nmax in the count values of the physical addresses 0, 1, 2, 3 reaches the allowable value "32". At this time, the count value "6" of the physical address 2 is largest, but the value does not reach the allowable value "32".

Therefore, at this time, the refresh operation is not performed.

(g) Refresh

Following the data renew request, the operations similar to the above-described operations of (c) and (d), or (e) and (f) are executed, and finally the count values of the physical addresses 0, 1, 2, 3 are assumed as in (g).

The controller 11 of FIG. 4 confirms that the maximum value Nmax of the count values of the physical addresses 0, 1, 2, 3 is "32", and gives the command to perform the refresh operation to the memory 10 of FIG. 4.

In the present example, the count values of the physical addresses 0, 1, 2, 3 are all "1" or more. That is, any of the physical addresses 0, 1, 2, 3 is the object of data write/erase at least once among 32 data write/erase operations. Therefore, there is not the physical address which has undergone 32 voltage stresses in the state in which the address is not the object of data write/erase.

However, as described above, as the worst case, the case is considered in which at least one physical address is not selected even once in 32 data write/erase operations. In this case, at least one physical address undergoes 32 voltage stresses in the state in which the address is not the object of data write/erase.

Then, when the maximum value Nmax of the count values of the physical addresses 0, 1, 2, 3 reaches the allowable value "32", the refresh operation is executed regardless of the count values of the respective physical addresses 0, 1, 2, 3.

It is to be noted that in the present example, in the initial state, all the physical addresses 0, 1, 2, 3 are in the erase state, and the first operation is the data write operation with respect to all the physical addresses 0, 1, 2, 3. Therefore, in the worst case, the address is not the object of data write/erase even once exactly in the second and subsequent operations.

That is, when the data of the memory cell is not destroyed by 32 voltage stresses, the maximum value Nmax of the count values of the physical addresses 0, 1, 2, 3 reaches "33" on the condition of refresh.

In the present example, the condition of refresh is based on the maximum value Nmax of the count values of the physical addresses 0, 1, 2, 3, but this condition is changed in accordance with the initial state of the memory. The important respect lies in that the worst case is assumed and the allowable value is determined based on the worst case.

In the refresh operation, the data stored in the data area is rewritten and thereby refreshed, but the count value of the redundancy area is initialized, for example, in the state of (b) at the refresh operation time. That is, in the write operation in the refresh, the count values "1", "2", "3", "4" are written in the redundancy areas corresponding to the physical addresses 0, 1, 2, 3, respectively.

② Method of Refresh Operation

Any method of the refresh operation may be used as long as the purpose of refreshing the data of the memory cell can be achieved before the data of the memory cell is destroyed by the threshold fluctuation by the voltage stress. For example, as the method of the refresh operation, Examples 1 and 2 described in Embodiment 1 can be used as such, and the detailed description thereof is therefore omitted.

③ Timing of Refresh Operation

The timing to perform the refresh operation is not especially limited.

For example, when the allowable value is "32", the maximum value Nmax of the count values of the physical addresses in the block reaches 32. When the 32nd write/erase operation is finished, the refresh operation may immediately be executed. Moreover, the refresh operation may also be executed in the appropriate timing after ending the 32nd write/erase operation, for example, after the access from host stops.

It is to be noted that in Example 2 the 32nd data write/erase operation is performed in the refresh operation. Therefore, when the maximum value Nmax of the count values of the physical addresses in the block reaches 32, the refresh operation is immediately executed together with the 32nd write/erase operation.

④ Others

In the present example, the count value starts with "0" like 0, 1, 2, . . . , and increases by "1" in accordance with the number of data renew times in the block, but the example of the present invention is not limited to this counting.

For example, in the same manner as in Example 1, the initial value may be the numeric value other than "0", such as "2", or the binary number "10". The increase value may be the numeric value other than "1", such as "2". In this case, the allowable value of the number of data write/erase times in the block also naturally changes.

In the present example, the count value is not larger than "32", and it is therefore sufficient to secure the number of bits with which the number can be counted up to "32" in the redundancy area of the memory cell array. That is, five bits in the redundancy area of the memory cell array may be used as the area for storing the count value.

Moreover, the increase value of the count value may not be like the arithmetic progression. As described in Example 1, for example, when four bytes, that is, 32 bits in the redundancy area of the memory cell array are used as the area for storing the count value, the number of data write/erase times may also be judged by the number of bits in the "1" state among these 32 bits. Moreover, for example, the number of data write/erase times may also be judged by the position of the bit in the "1" state in these 32 bits.

Furthermore, instead of increasing the count value in accordance with the number of data renew times, the value may also be decreased. For example, the initial value of the count value is set to "32", and this number may also be decreased by one in accordance with the number of data renew times.

(3) EXAMPLE 3

① Count Method

Figure 9:
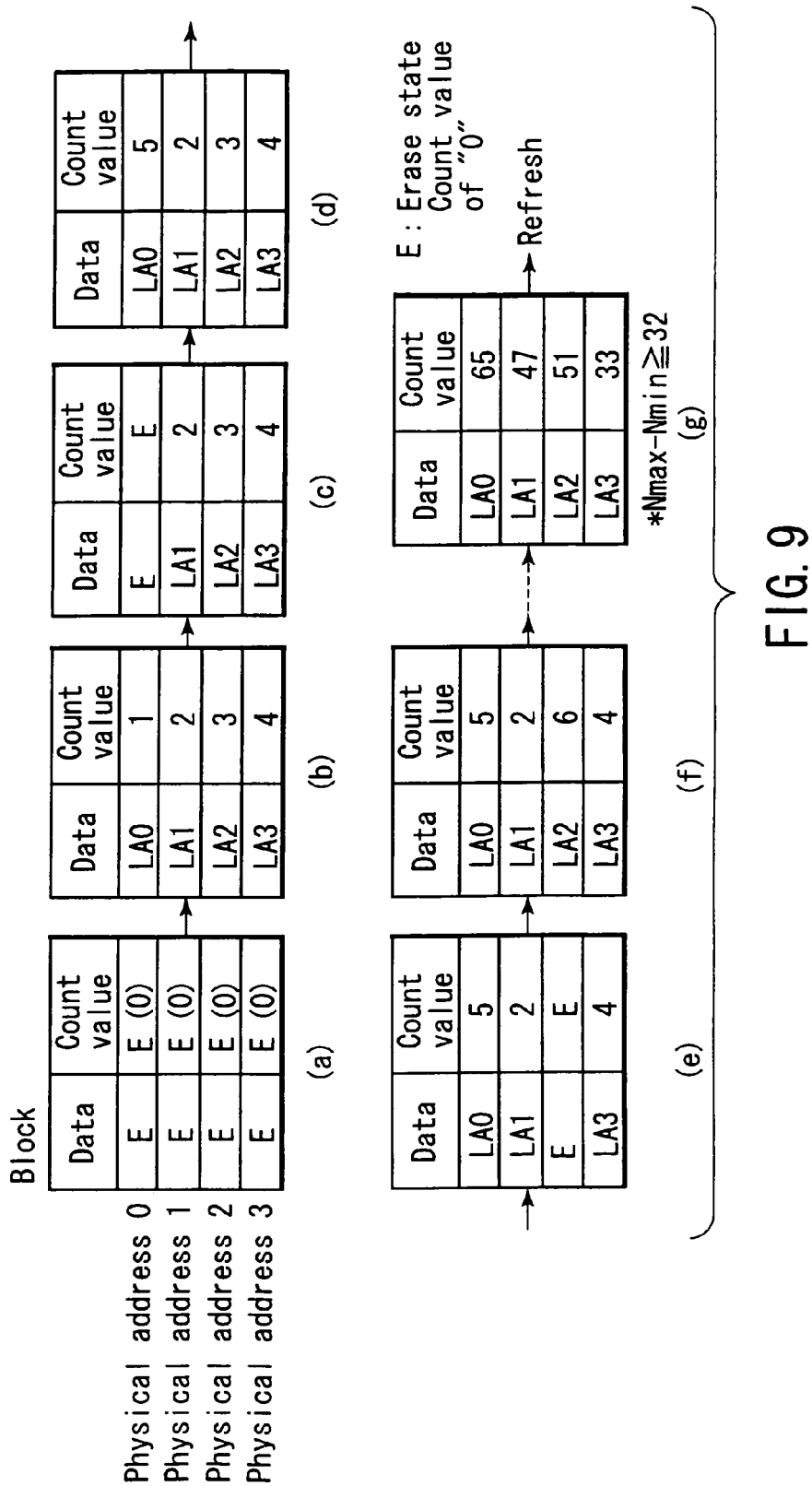
FIG. 9 is a diagram showing Example 3 of the count operation according to Embodiments 1, 2.

FIG. 9 shows the count method according to the example of the present invention.

In Examples 1 and 2 described above, a method is used comprising: assuming the worst condition; and performing the refresh operation, when the total value of the number of data write/erase times in the block reaches the allowable value, for example, 32. In this case, when the total value of the number of data write/erase times in the block reaches the allowable value, the refresh operation is constantly performed regardless of the number of data write/erase times in each page.

On the other hand, this means that it is not necessary to perform the refresh operation, and in this case each page in the block is an object of data write/erase in a short period (less than 32 times). Even in this case, when the number of data write/erase times in the block reaches the allowable value, the refresh operation is necessarily performed. That is, there is a possibility that a useless refresh operation is performed.

In Example 3, a method is proposed for completely removing the useless refresh operation.

The count method of Example 3 is the same as that of Example 2. That is, the count value of the page which is the object of data write/erase is se to the total value of the number of data write/erase times in the block including the page, not the number of data write/erase times with respect to the page.

However, in Example 3, a generation condition of refresh is different from that of Example 2.

In Example 2, the controller selects the maximum value Nmax from the count values of the respective pages in the block every data write/erase, and judges whether or not the maximum value Nmax reaches the allowable value, for example, 32. On the other hand, in Example 3, the controller selects the maximum value Nmax and minimum value Nmin from the count values of the respective pages in the block every data write/erase, and judges whether or not a difference between the maximum value Nmax and minimum value Nmin reaches, for example, 32.

Here, the count value indicating the maximum value Nmax means that the data of the page corresponding to the count value is renewed in a time closest to the present time. Moreover, the count value indicating the minimum value Nmin means that the data of the page corresponding to the count value is renewed in a time farthest from the present time.

Moreover, the difference between the maximum value Nmax and minimum value Nmin means the number of data write/erase times in the block after the data of the page having the count value indicating the minimum value Nmin is finally performed. That is, the memory cell in the page whose count value is the minimum value Nmin undergoes the number of voltage stresses corresponding to the difference between the maximum value Nmax and minimum value Nmin after the data of the page is finally renewed.

In this manner, in Example 3, the maximum value Nmax and minimum value Nmin are extracted from the count values of the respective pages in the block, and necessity of the refresh operation is judged with the difference.

An advantage of Example 3 lies in that the data write/erase operation can continuously be performed without executing any refresh operation, as long as the difference between the maximum value Nmax and minimum value Nmin is less than the allowable value. That is, the useless refresh operation is omitted in Example 3, and thereby the number of refresh operations can greatly be reduced as compared with Examples 1 and 2.

It is to be noted that also in the description of Example 3, the meaning of the physical addresses 0, 1, 2, 3 and logic addresses 0, 1, 2, 3 is the same as that of Example 1, and the description thereof is therefore omitted here. Moreover, since the meaning of LA0, LA1, LA2, LA3, and E is the same as that of Example 1, the description thereof is omitted here.

(a) Initial State

The memory cells in all the physical addresses (pages) 0, 1, 2, 3 in the block are in the erase state.

(b) Write

First, the data LA0 is written in the physical address 0, data LA1 is written in the physical address 1, data LA2 is written in the physical address 2, and data LA3 is written in the physical address 3.

At the write time of the data LA0 with respect to the physical address 0, "1" is written as the count value of the physical address 0, that is, the number of data write/erase times. Moreover, at the write time of the data LA1 with respect to the physical address 1, the second data write/erase is performed as seen in the whole block. Therefore, "2" is written as the count value of the physical address 1, that is, the number of data write/erase times.

Similarly, at the write time of the data LA2 with respect to the physical address 2, the third data write/erase is performed as seen in the whole block. Therefore, "3" is written as the count value of the physical address 2, that is, the number of data write/erase times. Moreover, at the write time of the data LA3 with respect to the physical address 3, the fourth data write/erase is performed as seen in the whole block. Therefore, "4" is written as the count value of the physical address 3, that is, the number of data write/erase times.

(c) and (d) Data Write/Erase of Physical Address 0

The controller 11 outputs the data renew request of the physical address 0 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. At this time, the count value "4" of the physical address 3 has the largest value. The controller 11 of FIG. 4 adds "1" to the count value "4" of the physical address 3, and uses the count value "5" as the count value of the physical address 0 which is the object of data write/erase. The count values of the physical addresses 0, 1, 2, 3 are temporarily stored, for example, in the memory (RAM, and the like) in the controller 11 of FIG. 4.

Thereafter, the data LA0 and count value stored in the physical address 0 are erased (see (c)). Subsequently, the renewed data LA0 and count value (="5") are written in the physical address 0 (see (d)).

Moreover, the controller 11 of FIG. 4 extracts the maximum value Nmax and minimum value Nmin from the count values of the physical addresses 0, 1, 2, 3, calculates the difference between the maximum value Nmax and minimum value Nmin, and judges whether or not the difference reaches the maximum value (allowable value) of the number of data write/erase times, that is, "32".

At this time, the count value "5" of the physical address 0 is largest, and the count value "2" of the physical address 1 is smallest. Therefore, the maximum value Nmax-minimum value Nmin is "3", and this numeric value is smaller than "32".

Therefore, at this time, the refresh operation is not performed.

(e) and (f) Data Write/Erase of Physical Address 2

The controller 11 outputs the data renew request of the physical address 2 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. At this time, the count value "5" of the physical address 0 has the largest value. The controller 11 of FIG. 4 adds "1" to the count value "5" of the physical address 0, and uses the count value "6" as the count value of the physical address 2 which is the object of data write/erase. The count values of the physical addresses 0, 1, 2, 3 are temporarily stored, for example, in the memory (RAM, and the like) in the controller 11 of FIG. 4.

Thereafter, the data LA2 and count value stored in the physical address 2 are erased (see (e)). Subsequently, the renewed data LA2 and count value (="6") are written in the physical address 2 (see (f)).

Moreover, the controller 11 of FIG. 4 extracts the maximum value Nmax and minimum value Nmin from the count values of the physical addresses 0, 1, 2, 3. Subsequently, the controller calculates the difference between the maximum value Nmax and minimum value Nmin and judges whether or not the difference reaches the maximum value (allowable value) of the number of data write/erase times, that is, "32".

At this time, the count value "6" of the physical address 2 is largest, and the count value "2" of the physical address 1 is smallest. Therefore, the maximum value Nmax-minimum value Nmin is "4", and this numeric value is smaller than "32".

Therefore, at this time, the refresh operation is not performed.

(g) Refresh

Following the data renew request, the operations similar to the above-described operations of (c) and (d), or (e) and (f) are executed, and finally the count values of the physical addresses 0, 1, 2, 3 are assumed as in (g).

The controller 11 of FIG. 4 extracts the maximum value Nmax and minimum value Nmin from the count values of the physical addresses 0, 1, 2, 3. The maximum value Nmax is the count value of the physical address 0, and the value is "65". Moreover, the minimum value Nmin is the count value of the physical address 3, and the value is "33". The difference between the maximum value Nmax and minimum value Nmin is "32".

That is, after the data of the physical address 3 is finally renewed, the physical address 3 undergoes the voltage stress by 32 (=65−33) data write/erase times. Therefore, the controller 11 of FIG. 4 confirms this fact, and gives the command to perform the refresh operation to the memory 10 of FIG. 4.

In the present example, the necessity of the refresh operation is judged based on the difference between the maximum value Nmax and minimum value Nmin of the count values of the respective physical addresses 0, 1, 2, 3 in the block. Therefore, when the difference is less than the allowable value, it is not necessary to perform the refresh operation. As the case may be, without performing any refresh operation, the data write/erase operation can continuously be performed.

Moreover, in the present example, since the necessity of the refresh operation is judged based on the difference between the maximum value Nmax and minimum value Nmin of the count values, the condition of refresh does not depend on the initial state of the memory as in Examples 1, 2. Moreover, in the present example, different from Examples 1, 2, it is unnecessary to assume the worst case and set the condition of refresh.

In the refresh operation, the data stored in the data area is rewritten and thereby refreshed, but the count value of the redundancy area is initialized, for example, in the state of (b) at the refresh operation time. That is, in the write operation in the refresh, the count values "1", "2", "3", "4" are written in the redundancy areas corresponding to the physical addresses 0, 1, 2, 3, respectively.

It is to be noted that in the present example, when the above-described refresh condition (Nmax−Nmin≧32) is satisfied, only the physical address having the count value indicating the minimum value Nmin may also be refreshed. In this case, after the refresh operation, only the count value of the physical address which is the object of refresh is renewed, and the other count values are continuously counted as such without being initialized.

For example, in the example of FIG. 9, in (g), only the physical address LA3 is refreshed. By this refresh operation, the count value of the physical address LA3 may also be set to "66" (=65+1). Since the data of physical addresses LA0, LA1, LA2 is not refreshed, the present state of the count value is maintained.

② Method of Refresh Operation

Any method of the refresh operation may also be used as long as the purpose of refreshing the data of the memory cell can be achieved before the data of the memory cell is destroyed by the threshold fluctuation by the voltage stress. For example, as the method of the refresh operation, Examples 1 and 2 described in Embodiment 1 can be used as such, and the detailed description thereof is therefore omitted.

Additionally, in the present example, as described above, the refresh operation may also be performed with respect to all the physical addresses in the block. Moreover, the operation may also be performed only with respect to the physical address whose count value is the minimum value Nmin among the physical addresses in the block.

③ Timing of Refresh Operation

The timing to perform the refresh operation is not especially limited.

For example, when the allowable value is "32", the difference between the maximum value Nmax and minimum value Nmin of the count values of the physical addresses in the block reaches "32". When the write/erase operation is finished, the refresh operation may immediately be executed. Moreover, the refresh operation may also be executed in the appropriate timing after ending the write/erase operation, for example, after the access from host stops.

In Embodiment 2 the data write/erase operation is performed in the refresh operation, when the difference between the maximum value Nmax and minimum value Nmin reaches "32". Therefore, when the difference between the maximum value Nmax and minimum value Nmin of the count values of the physical addresses in the block reaches "32", the refresh operation is immediately executed.

④ Others

In the present example, the count value starts with "0" like 0, 1, 2, . . . , and increases by "1" in accordance with the number of data renew times in the block, but the example of the present invention is not limited to this counting.

For example, in the same manner as in Example 1, the initial value may be the numeric value other than "0", such as "2", and the increase value may be the numeric value other than "1", such as "2".

In the present example, when the maximum value Nmax-minimum value Nmin does not satisfy the refresh condition, the count value increases without any limit. However, the number of bits of the redundancy area for storing the count value has a limitation.

Then, for example, when the count value reaches an upper limit value determined by the number of bits of the redundancy area for storing the count value, all the physical addresses in the block are refreshed regardless of the above-described refresh condition, and the count values of all the physical addresses may also be initialized.

The increase value of the count value may not be like the arithmetic progression. As described in Example 1, for example, when four bytes, that is, 32 bits in the redundancy area of the memory cell array are used as the area for storing the count value, the number of data write/erase times may also be judged by the number of bits in the "1" state among these 32 bits. Moreover, for example, the number of data write/erase times may also be judged by the position of the bit in the "1" state in these 32 bits.

Furthermore, instead of increasing the count value in accordance with the number of data renew times, the value may also be decreased. For example, the initial value of the count value is set to the upper limit value determined by the number of bits of the redundancy area for storing the count value, and this number may also be decreased one by one in accordance with the number of data renew times.

7. Embodiment 3

Embodiment 3 will be described hereinafter.

Embodiment 3 relates to a system which can handle breaking of a power supply during data renew (for a memory card, abrupt extraction from a main body is included).

As described in Examples 1, 2, 3 of the count operation according to Embodiments 1, 2, examples of the method of data renew (data write/erase) for use include a method comprising: a. transferring the count values of all the physical addresses in the block of the flash memory to a non-volatile memory (RAM, and the like) in the controller; b. subsequently erasing old data and count value of the physical address which is the object of data renew; and c. subsequently rewriting new data in the physical address which is the object of data renew and rewriting a new count value in the redundancy area.

In this case, when the breaking of the power supply occurs between steps b. and c., all the old and new data and old and new count values disappear with respect to the physical address which is the object of data renew.

As described later, in the example of the present invention, with application to file renew of a personal computer, the example is assumed to be effective with respect to the renew of file allocation table (FAT) information whose data is renewed with a relatively small capacity and high frequency. However, when the example of the present invention is applied, and the data is lost by the breaking of the power supply, systems such as the personal computer are mortally damaged.

Embodiment 3 is a modification example obtained by modifying Embodiment 1 so that the breaking of the power supply can also be handled.

It is to be noted that in Embodiment 3, mainly a data renew method will be described hereinafter, but the embodiment can also be applied to the refresh method. That is, according to Embodiment 3, by the similar principle, the breaking of the power supply at a refresh operation time can be handled.

Since the definition and meaning of the refresh operation are the same as those of Embodiment 1, the description thereof is omitted here.

Figure 10:
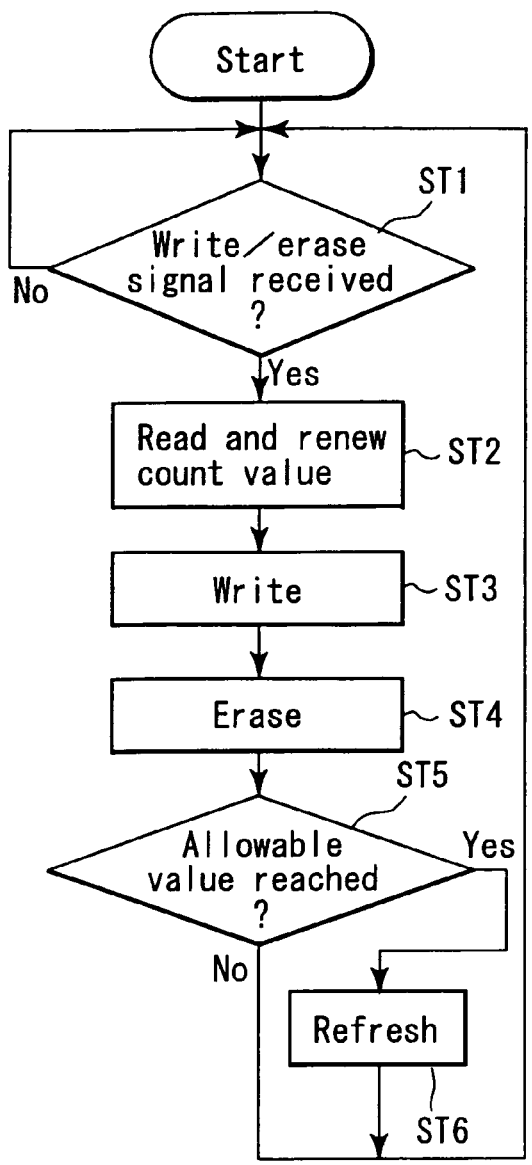
FIG. 10 is a flowchart showing the data renew operation according to Embodiment 3 of the present invention.

FIG. 4 shows a system according to Embodiment 3 of the present invention. FIG. 10 shows a main part of the operation of the system according to Embodiment 3 of the present invention.

Since the memory 10 and controller 11 have been described above in Embodiment 1, the description is omitted here.

In Embodiment 3, as a precondition, two memory areas (nonvolatile) are used in a pair. The respective memory areas include one or more pages. Alternatively, two memory areas include the same number of pages.

Two memory areas may both be disposed in one block of the memory 10. Alternatively, two memory areas may also be disposed in different blocks of the memory 10. Furthermore, two memory areas may also be disposed in different memories.

First, on receiving the write/erase signal from the controller 11, the memory 10 reads the data and count values of all the pages in two memory areas including the page in which the data is to be written/erased (steps ST1 and ST2).

The controller 11 renews the count value with respect to the page in which the data is to be written/erased. Here, Embodiment 3 is different from Embodiment 1 in that thereafter the data write is immediately executed and thereafter the data erase is executed (steps ST3 and ST4).

To execute the data write/erase with respect to the page in one memory area, the data write is executed with respect to the page in one memory area which forms the pair with another memory area. In the data write, new data is stored in the data area, and new count value is stored in the redundancy area.

After the data write, the data erase is performed.

The data erase is executed with respect to the page in one memory area. The data erase may be the page erase in which the data is erased by the page unit, or the block or chip erase in which the data is erased by the block or chip unit.

Next, the controller 11 judges whether or not the number of data write/erase times reaches the maximum value (allowable value) based on the count value of each page in two memory areas (step ST5).

When the number of data write/erase times does not reach the maximum value (allowable value), any operation according to the present invention is not especially performed. That is, the memory 10 performs the usual operation under the control of the controller 11.

When the number of data write/erase times reaches the maximum value (allowable value), the controller 11 issues the command to the memory 10 to perform the refresh operation. When the refresh operation is performed, in principle, the number of data write/erase times (count value) of each page in two memory areas is initialized. Additionally, the number of data write/erase times may not be initialized depending on the count method in some case (step ST6).

As described above, in Embodiment 3, two memory areas are used in the pair. After the new data and count value are constantly written in one of two memory areas, the old data and count value stored in the other memory area are erased. Therefore, even when the breaking of the power supply occurs during the data write/erase operation, the data and count value are stored in either one of two memory areas, and therefore the system is not mortally damaged.

8. Embodiment 4

Embodiment 4 will be described hereinafter. This embodiment is a modification example of Embodiment 3. Since the definition and meaning of the refresh operation are the same as those of Embodiment 1, the description thereof is omitted here.

In Embodiment 3, when the number of data write/erase times satisfies the predetermined condition, the refresh operation is performed. On the other hand, in Embodiment 4, the final data write/erase operation in which the count value reaches the allowable value is performed in the refresh operation.

In Embodiment 3, in order to prevent the data from being lost by the abrupt breaking of the power supply, two memory areas (nonvolatile) are used in the pair. In the data renew operation, the erase operation is performed after performing the write operation. However, the refresh operation is simultaneously performed with respect to two memory areas.

Therefore, in method 4, for the final data renew operation in which the count value reaches the allowable value, for example, in a method similar to that of Embodiment 2, the refresh operation (including the data write/erase operation) is executed.

Additionally, with presence of an unused memory area (nonvolatile), at a refresh time, after writing new data and count value in the unused memory area, the data and count value of two memory areas may also be erased.

Figure 11:
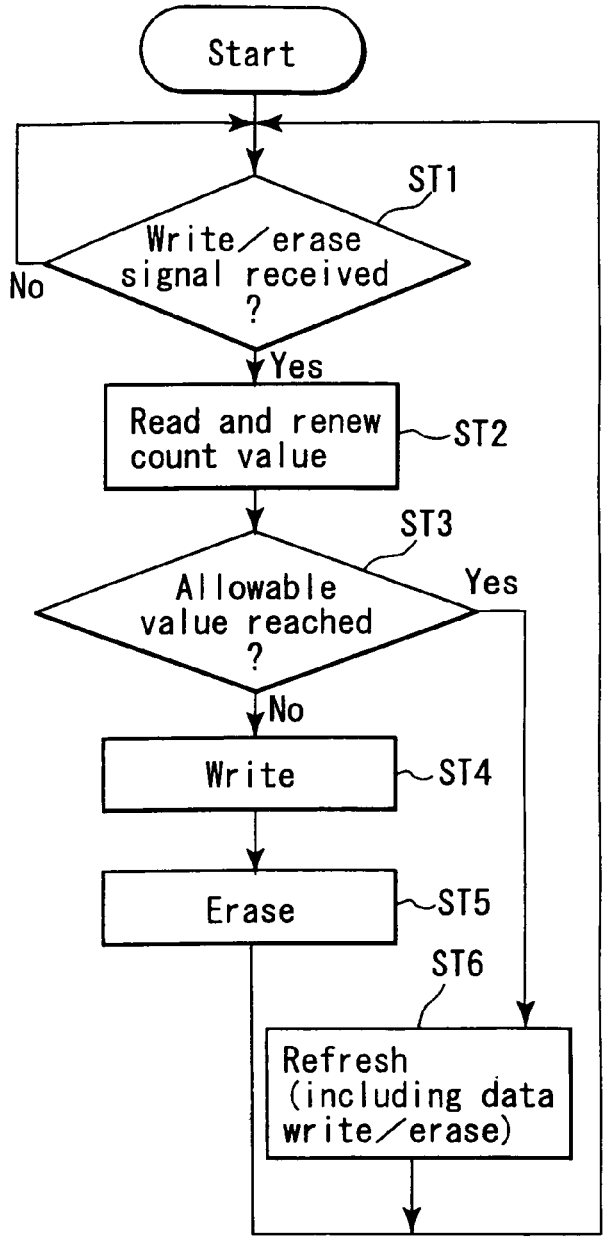
FIG. 11 is a flowchart showing the data renew operation according to Embodiment 4 of the present invention.

FIG. 4 shows the system according to Embodiment 4 of the present invention. FIG. 11 shows the major part of the operation of the system according to Embodiment 4 of the present invention.

Since the memory 10 and controller 11 have been described above in Embodiment 1, the description thereof is omitted here.

First, on receiving the write/erase signal from the controller 11, the memory 10 reads the data and count values of all the pages in the selected block including the page in which the data is to be written/erased (steps ST1 and ST2). The controller 11 renews the number of data write/erase times with respect to the page in which the data is to be written/erased among all the pages in the selected block (step ST2).

Next, the controller 11 judges whether or not the number of data write/erase times reaches the maximum value (allowable value) based on the count value of each page in the selected block (step ST3).

When the number of data write/erase times does not reach the maximum value (allowable value), the data is written and erased (steps ST4 and ST5).

To execute the data write/erase with respect to the page in one memory area, the data write is executed with respect to the page in one memory area which forms the pair with another memory area. In the data write, new data is stored in the data area, and new count value is stored in the redundancy area.

After the data write, the data erase is performed.

The data erase is executed with respect to the page in one memory area. The data erase may be the page erase in which the data is erased by the page unit, or the block or chip erase in which the data is erased by the block or chip unit.

When the number of data write/erase times reaches the maximum value (allowable value), the controller 11 issues the command to the memory 10 to perform the refresh operation (step ST6). Therefore, the data in two memory areas forming the pair is refreshed, and the data is written/erased with respect to the page which is the object of data write/erase.

When the refresh operation is performed, in principle, the number of data write/erase times (count value) of each page in two memory areas is initialized. Additionally, the number of data write/erase times may not be initialized depending on the counting method in some case.

9. Example of Count Operation according to Embodiments 3, 4

The example of the count operation according to Embodiments 3, 4 will be described hereinafter.

(1) EXAMPLE 1

① Data Renew Method

Figure 12:
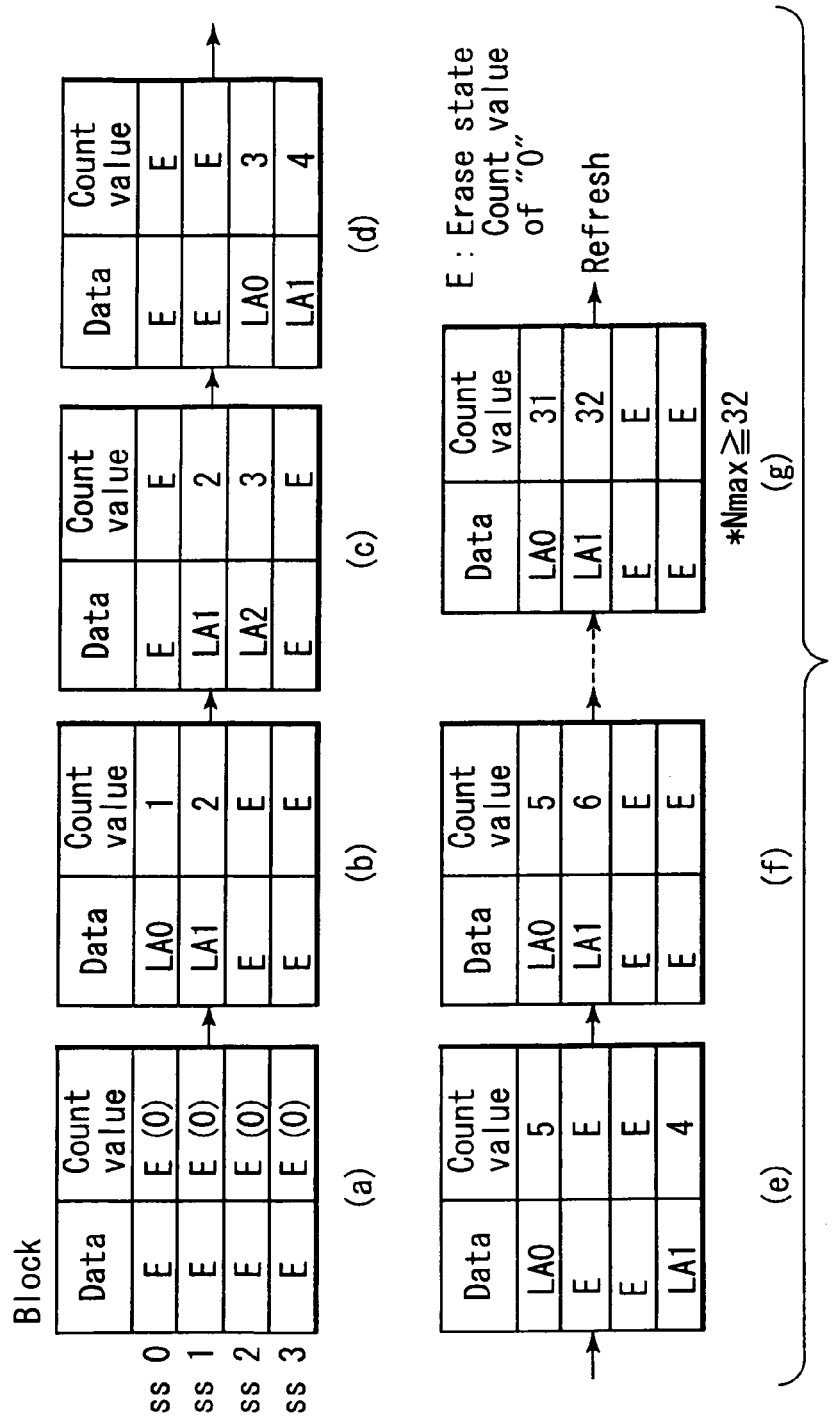
FIG. 12 is a diagram showing Example 1 of the count operation according to Embodiments 3, 4.

FIG. 12 shows a data renew method according to the example of the present invention.

It is to be noted that in the present example, as the count method, the method of Example 2 of the count operation according to Embodiments 1, 2 is applied.

In the present example, one block includes four physical addresses. In one block, the half, that is, only the data for two physical addresses (two pages) is stored. In this respect, the present example is different from Examples 1, 2, 3 of the count operation according to Embodiments 1, 2 in which the data for four physical addresses (four pages) is stored in four physical addresses in one block.

The physical addresses 0, 1 constitute one memory area, and the physical addresses 2, 3 constitute another memory area. These two memory areas constitute the pair concerning the data renew operation.

(a) Initial State

The memory cells in all the physical addresses (pages) 0, 1, 2, 3 in the block are in the erase state.

(b) Write

First, the data LA0 is written in the physical address 0, and data LA1 is written in the physical address 1. At the write time of the data LA0 with respect to the physical address 0, "1" is written as the count value of the physical address 0, that is, the number of data write/erase times. Moreover, at the write time of the data LA1 with respect to the physical address 1, the second data write/erase is performed as seen in the whole block. Therefore, "2" is written as the count value of the physical address 1, that is, the number of data write/erase times.

(b) and (c) Data Write/Erase of Physical Address 0

The controller 11 outputs the data renew request of the physical address 0 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. It is to be noted that the count value denoted with E (erase state) corresponds to "0". At this time, the count value "2" of the physical address 1 has the largest value. The controller 11 of FIG. 4 adds "1" to the count value "2" of the physical address 1, and sets the count value "3" as the count value of the physical address 2. The count values of the physical addresses 0, 1, 2, 3 are temporarily stored, for example, in the memory (RAM, and the like) in the controller 11 of FIG. 4.

Thereafter, the data LA0 and count value (="3") are written in the physical address 2 (see (c)). Subsequently, the data LA0 and count value stored in the physical address 0 are erased (see (c)). After writing the renewed data LA0 and count value inn this manner, the old data LA0 and count value are erased. Therefore, the abrupt breaking of the power supply can sufficiently be handled.

Moreover, the controller 11 of FIG. 4 judges whether or not the maximum value Nmax of the count values of the physical addresses 0, 1, 2, 3 reaches the allowable value "32". At this time, the count value "3" of the physical address 2 is largest, but the value does not reach the allowable value "32".

Therefore, at this time, the refresh operation is not performed.

(c) and (d) Data Write/Erase of Physical Address 1

The controller 11 outputs the data renew request of the physical address 1 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. At this time, the count value "3" of the physical address 2 has the largest value. The controller 11 of FIG. 4 adds "1" to the count value "3" of the physical address 2, and sets the count value "4" to the count value of the physical address 3. The count values of the physical addresses 0, 1, 2, 3 are temporarily stored, for example, in the memory (RAM, and the like) in the controller 11 of FIG. 4.

Thereafter, the data LA1 and count value (="4") are written with respect to the physical address 3 (see (d)). Subsequently, thereafter, the data LA1 and count value stored in the physical address 1 are erased (see (d)).

Moreover, the controller 11 of FIG. 4 judges whether or not the maximum value Nmax of the count values of the physical addresses 0, 1, 2, 3 reaches the allowable value "32". At this time, the count value "4" of the physical address 3 is largest, but the value does not reach the allowable value "32".

Therefore, at this time, the refresh operation is not performed.

(d) and (e) Data Write/Erase of Physical Address 2

The controller 11 outputs the data renew request of the physical address 0 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. At this time, the count value "4" of the physical address 3 has the largest value. The controller 11 of FIG. 4 adds "1" to the count value "4" of the physical address 3, and sets the count value "5" as the count value of the physical address 0. The count values of the physical addresses 0, 1, 2, 3 are temporarily stored, for example, in the memory (RAM, and the like) in the controller 11 of FIG. 4.

Thereafter, the renewed data LA0 and count value (="5") are written with respect to the physical address 0 (see (e)). Subsequently, thereafter, the data LA0 and count value stored in the physical address 2 are erased (see (e)).

Moreover, the controller 11 of FIG. 4 judges whether or not the maximum value Nmax of the count values of the physical addresses 0, 1, 2, 3 reaches the allowable value "32". At this time, the count value "5" of the physical address 0 is largest, but the value does not reach the allowable value "32".

Therefore, at this time, the refresh operation is not performed.

(e) and (f) Data Write/Erase of Physical Address 3

The controller 11 outputs the data renew request of the physical address 3 to the memory 10 (see FIG. 4).

First, the count values of all the physical addresses 0, 1, 2, 3 in the block are read. The controller 11 of FIG. 4 selects the maximum value Nmax from the count values of the physical addresses 0, 1, 2, 3. At this time, the count value "5" of the physical address 0 has the largest value. The controller 11 of FIG. 4 adds "1" to the count value "5" of the physical address 0, and sets the count value "6" to the count value of the physical address 1. The count values of the physical addresses 0, 1, 2, 3 are temporarily stored, for example, in the memory (RAM, and the like) in the controller 11 of FIG. 4.

Thereafter, the renewed data LA1 and count value (="6") are written with respect to the physical address 1 (see (f)). Subsequently, thereafter, the data LA1 and count value stored in the physical address 3 are erased (see (f)).

Moreover, the controller 11 of FIG. 4 judges whether or not the maximum value Nmax of the count values of the physical addresses 0, 1, 2, 3 reaches the allowable value "32". At this time, the count value "6" of the physical address 1 is largest, but the value does not reach the allowable value "32".

Therefore, at this time, the refresh operation is not performed.

(g) Refresh

Following the data renew request, the above-described operation is repeatedly executed, and finally the count values of the physical addresses 0, 1, 2, 3 are assumed as in (g).

The controller 11 of FIG. 4 confirms that the maximum value Nmax of the count values of the physical addresses 0, 1, 2, 3 is "32". Then, the command to perform the refresh operation is given to the memory 10 of FIG. 4.

It is to be noted that for the refresh operation, the same method as that of Examples 1, 2, 3 of the count operation according to Embodiments 1, 2 can be used. Additionally, in the present example, the above-described data renew method can also be applied to the refresh method.

For example, it is assumed that the count values of the physical addresses 0, 1, 2, 3 are in a state as shown in (g). First, the controller 11 reads the data and count value of the physical addresses 0, 1 in the block.

Thereafter, the data LA0 and count value (="1") are written in the physical address 2, and the data LA1 and count value (="2") are written in the physical address 3. Subsequently, thereafter, the data LA0, LA1 and count value stored in the physical addresses 0, 1 are erased.

As described above, the refresh operation ends.

As described above, in Example 1, after the new data is constantly written in the flash memory, the old data is erased. Therefore, even when the breaking of the power supply occurs in a stage of write of the new data in the flash memory, the state immediately before the data renew is stored at minimum, and the mortal damage in the system is avoided.

Example 1 is effective in writing/erasing logic data having a sufficiently small capacity as compared with a block capacity. In this case, two memory areas constituting the pair in the present embodiment can be disposed in one block.

② Method of Refresh Operation

As described above, for the method of the refresh operation, Examples 1, 2 of the count operation according to Embodiments 1, 2 can be used as such. Additionally, the data renew method in the present embodiment can also be applied.

③ Timing of Refresh Operation

The timing to perform the refresh operation is not especially limited.

For example, when the allowable value is "32", the maximum value Nmax of the count values of the physical addresses in the block reaches "32", and when the 32nd write/erase operation is finished, the refresh operation may immediately be executed. Moreover, the refresh operation may also be executed in the appropriate timing after ending the 32nd write/erase operation, for example, after the access from host stops.

It is to be noted that in Embodiment 4 the 32nd data write/erase operation is performed in the refresh operation. Therefore, when the maximum value Nmax of the count values of the physical addresses in the block reaches 32, the refresh operation is immediately executed together with the 32nd data write/erase operation.

④ Others

In the present example, the count value starts with "0" like 0, 1, 2, . . . , and increases by "1" in accordance with the number of data renew times in the block, but the example of the present invention is not limited to this counting.

For example, in the same manner as in Example 1 of the count operation according to Embodiments 1, 2, the initial value may be the numeric value other than "0", such as "2", and the increase value may be the numeric value other than "1", such as "2". In this case, the allowable value of the number of data write/erase times also naturally changes.

In the present example, the count value is not larger than "32", and it is therefore sufficient to secure the number of bits with which the number can be counted up to "32" in the redundancy area of the memory cell array. That is, five bits in the redundancy area of the memory cell array may be used as the area for storing the count value.

Moreover, the increase value of the count value may not be like the arithmetic progression. As described in Example 1, for example, when four bytes, that is, 32 bits in the redundancy area of the memory cell array are used as the area for storing the count value, the number of data write/erase times may also be judged by the number of bits in the "1" state among these 32 bits. Moreover, for example, the number of data write/erase times may also be judged by the position of the bit in the "1" state in these 32 bits.

Furthermore, instead of increasing the count value in accordance with the number of data renew times, the value may also be decreased. For example, the initial value of the count value is set to "32", and this number may also be decreased one by one in accordance with the number of data renew times.

(2) EXAMPLE 2

Figure 13:
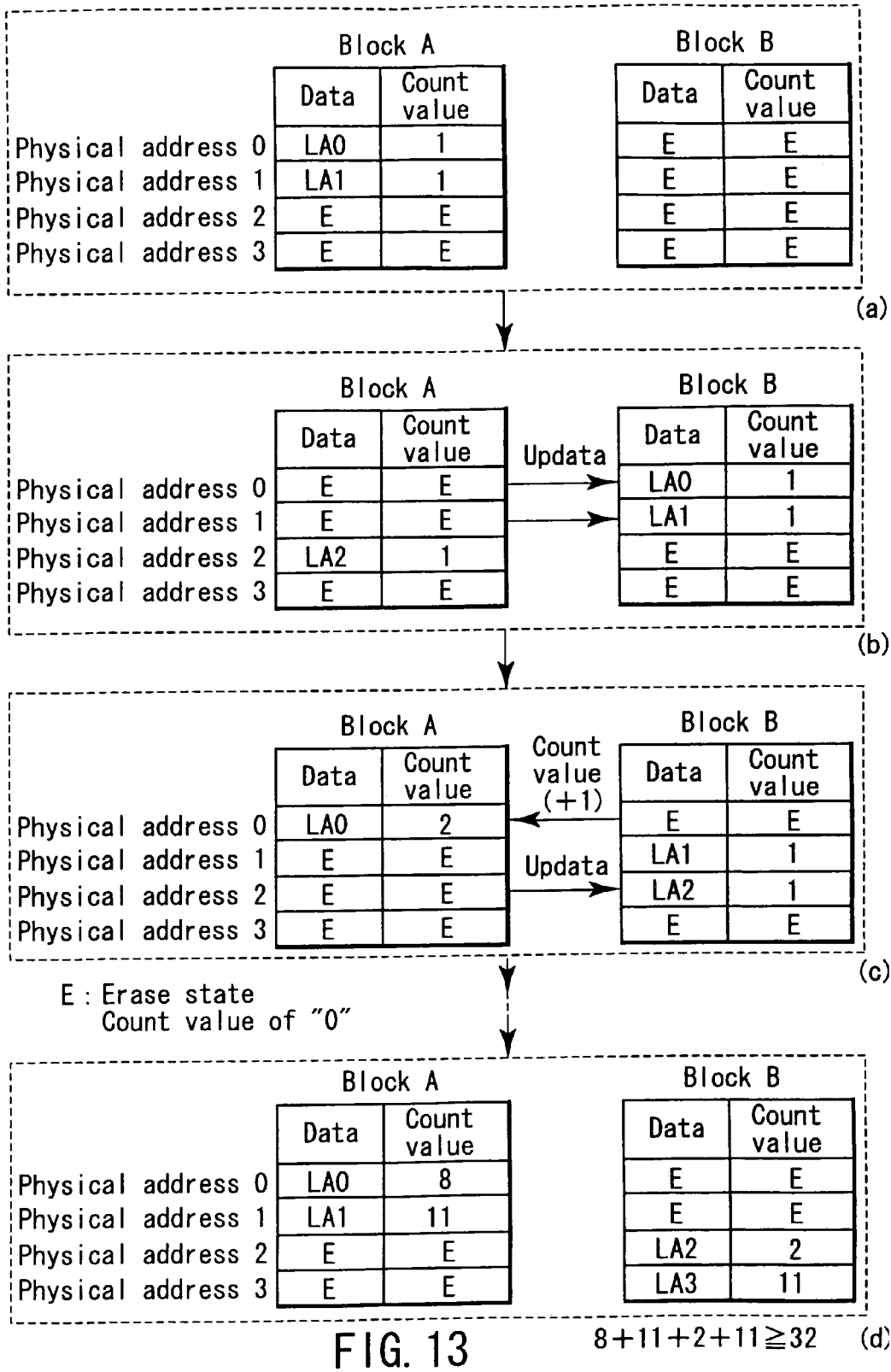
FIG. 13 is a diagram showing Example 2 of the count operation according to Embodiments 3, 4.

FIG. 13 shows the data renew method according to the example of the present invention.

In the present example, as the count method, the method of Example 1 of the count operation according to Embodiments 1, 2 is used. However, the other count methods such as the method of Examples 2, 3 of the count operation according to Embodiments 1, 2 can also be used.

In the present example, two different blocks A, B are used as the pair. These two blocks A, B may be disposed in one NAND-type flash memory or in different NAND-type flash memories. Each of the blocks A, B includes four physical addresses.

In the present example, when the data is written/erased with respect to the specific physical address a plurality of times, the data is alternately written with respect to two blocks A, B every time. After the write operation, the old data is erased every time. Moreover, the count value is renewed at a odd-numbered write time. For example, when the write starts from a block A side, the count value is renewed only at the write time with respect to the block A. At the write time with respect to the block B, the count value is not renewed.

(a) Initial State

The data LA0 is written in the physical address 0 of the block A, and data LA1 is written in the physical address 1 of the block A. The count values of the physical addresses 0, 1, that is, the numbers of data write/erase times are both "1". The physical addresses 2, 3 and count values of the block A are in the erase state, and the physical addresses 0, 1, 2, 3 and count values of the block B are in the erase state.

(b)-1 Data Write/Erase of Physical Address 0

The controller 11 outputs the data renew request of the physical address 0 to the memory 10 (see FIG. 4).

First, the count values of the physical address 0 in the blocks A, B are read. The count value of the physical address 0 in the block A is "1", and the count value of the physical address 0 in the block B is "0". Therefore, the renewed data LA0 and count value (="1") are subsequently written in the physical address 0 of the block B.

Here, at the write time with respect to the block B, the count value is not renewed. That is, the count value of the physical address 0 in the block A is written as the count value of the physical address 0 in the block B without being changed.

Thereafter, the data LA0 and count value stored in the physical address 0 in the block A are erased. In this manner, in the present example, after writing the renewed data LA0 and count value, the old data LA0 and count value are erased. Therefore, the abrupt breaking of the power supply can sufficiently be handled.

Moreover, the controller 11 of FIG. 4 judges whether or not the total value of the count values of the physical addresses 0, 1, 2, 3 in the blocks A, B reaches the allowable value "32". At this time, the total value of the count values is "2", and does not reach the allowable value "32".

Therefore, at this time, the refresh operation is not performed.

(b)-2 Data Write/Erase of Physical Address 1

The controller 11 outputs the data renew request of the physical address 1 to the memory 10 (see FIG. 4).

First, the count values of the physical addresses 1 in the blocks A, B are read. The count value of the physical address 1 in the block A is "1", and the count value of the physical address 1 in the block B is "0". Therefore, the renewed data LA1 and count value (="1") are subsequently written in the physical address 1 in the block B. Here, at the write time with respect to the block B, the count value is not renewed. Thereafter, the data LA1 and count value stored in the physical address 1 in the block A are erased.

Moreover, the controller 11 of FIG. 4 judges whether or not the total value of the count values of the physical addresses 0, 1, 2, 3 in the blocks A, B reaches the allowable value "32". At this time, the total value of the count values is "2", and does not reach the allowable value "32".

Therefore, at this time, the refresh operation is not performed.

(b)-3 Data Write/Erase of Physical Address 2

The controller 11 outputs the data renew request of the physical address 2 to the memory 10 (see FIG. 4).

First, the count values of the physical addresses 2 in the blocks A, B are read. The count value of the physical address 2 in the block A is "0", and the count value of the physical address 0 in the block B is also "0". When both are "0", the renewed data LA2 and count value (="1") are written in the physical address 2 in the block A.

Moreover, the controller 11 of FIG. 4 judges whether or not the total value of the count values of the physical addresses 0, 1, 2, 3 in the blocks A, B reaches the allowable value "32". At this time, the total value of the count values is "3", and does not reach the allowable value "32".

Therefore, at this time, the refresh operation is not performed.

(c)-1 Data Write/Erase of Physical Address 0

The controller 11 outputs the data renew request of the physical address 0 to the memory 10 (see FIG. 4).

First, the count values of the physical addresses 0 in the blocks A, B are read. The count value of the physical address 0 in the block A is "0", and the count value of the physical address 0 in the block B is "1". Therefore, the renewed data LA0 and count value (="2") are subsequently written in the physical address 0 in the block A. Here, at the write time with respect to the block A, the count value is renewed (+1 in the present example).

In this control, the count value indicates the number of write/erase times with respect to a physical address i in the block A or block B. That is, the data is stored in either one of blocks A, B, and the count value indicates the number of data write/erase times with respect to the physical address i in the blocks A, B.

Thereafter, the data LA0 and count value stored in the physical address 0 in the block B are erased.

Moreover, the controller 11 of FIG. 4 judges whether or not the total value of the count values of the physical addresses 0, 1, 2, 3 in the blocks A, B reaches the allowable value "32". At this time, the total value of the count values is "4", and does not reach the allowable value "32".

Therefore, at this time, the refresh operation is not performed.

(c)-2 Data Write/Erase of Physical Address 2

The controller 11 outputs the data renew request of the physical address 2 to the memory 10 (see FIG. 4).

First, the count values of the physical addresses 2 in the blocks A, B are read. The count value of the physical address 2 in the block A is "1", and the count value of the physical address 0 in the block B is "0". Therefore, the renewed data LA2 and count value (="1") are written in the physical address 2 in the block B.

Moreover, the controller 11 of FIG. 4 judges whether or not the total value of the count values of the physical addresses 0, 1, 2, 3 in the blocks A, B reaches the allowable value "32". At this time, the total value of the count values is "4", and does not reach the allowable value "32".

Therefore, at this time, the refresh operation is not performed.

(d) Refresh

Following the data renew request, the above-described operation is repeatedly executed, and finally the count values of the physical addresses 0, 1, 2, 3 are assumed as in (d).

The number of data write/erase times is as follows. In the block A, the physical address 0 indicates eight times, the physical address 1 indicates eleven times, the physical address 2 indicates twice, and the physical address 3 indicates eleven times. For the physical addresses 2, 3, the count value is equal to that of the physical addresses 2, 3 in the block B.

In the block B, the physical address 0 indicates seven times, the physical address 1 indicates ten times, the physical address 2 indicates twice, and the physical address 3 indicates eleven times. For the physical addresses 0, 1, the count value is a value obtained by subtracting the increase value ("1" in the present example) of the count value from the count value of the physical addresses 0, 1 in the block A.

Since the data write/erase operations is performed 32 times in total in the block A, the refresh operation is thereafter executed with respect to both the blocks A, B.

For example, after the data of all the physical addresses 0, 1, 2, 3 are collected in the block B, the data of all the physical addresses 0, 1, 2, 3 in the block A are erased. Thereafter, after the data of all the physical addresses 0, 1, 2, 3 are collected in the block A from the block B, the data of all the physical addresses 0, 1, 2, 3 in the block B are erased. Then, the refresh can easily be performed.

Moreover, after transferring the data of all the physical addresses 0, 1, 2, 3 to a buffer in the system, the data of all the physical addresses 0, 1, 2, 3 in the blocks A, B are erased. Thereafter, the data of all the physical addresses 0, 1, 2, 3 may also be returned to the block A from the buffer in the system. Instead of the buffer, another block in the flash memory may also be used.

In the present example, in this manner, two blocks A, B are used as the pair, and the data renew is continued. The blocks A, B may exist in the same flash memory chip or in the different flash memory chips. When a plurality of flash memory chips exist in the system (e.g., a flash memory card), the blocks A, B may also be allocated to different flash memory chips in the system. In this case, during the write operation with respect to the block B, the page erase is performed with respect to the block A, and this can contribute to enhancement of capability of the system.

(3) EXAMPLE 3

FIG. 14 shows the data renew method according to the example of the present invention.

In the present example, for example, another block of the NAND-type flash memory is used like the buffer. Here, the block in which the data is renewed is referred to as the block A. A block for use as a data buffer for temporarily storing the data at a data renew time is referred to as a buffer block.

(a) Initial State

The data LA0 is stored in the physical address 0. The data write/erase times with respect to the physical address 0, that is, the count value is set to "0".

(b) to (d) Data Write/Erase of Physical Address 0

The controller 11 outputs the data renew request of the physical address 0 to the memory 10 (see FIG. 4).

First, the count values of all the physical addresses 0, 1, 2, 3 in the block A are read. Moreover, the count value "1" of the physical address 0 which is the object of data write/erase and the renewed data LA0 are written in the buffer block (see (b)).

Therefore, the old data LA0 and count value of the physical address 0 in the block A are erased (see (c)).

Moreover, the controller 11 of FIG. 4, the count value of the physical address 0 is renewed. For example, the increase value of the count value, "1" in the present example, is added to the count value "1" of the physical address 0. As a result, the count value of the physical address 0 is "2". Subsequently, the count value "2" and renewed data LA0 are written in the physical address 0 in the block A (see (d)).

Thereafter, the renewed data LA0 and count value of the physical address 0 in the buffer block are erased (see (d)).

The operation is repeated. When the count values of the physical addresses 0, 1, 2, 3 in the block A satisfy the refresh condition, the refresh operation is executed. According to the present example, the renewed data and count value are constantly stored in at least one of the block A and buffer block. For example, even when emergency situations such as the abrupt breaking of the power supply occur, the mortal damage in the system can be avoided.

10. Other Embodiments

Examples 1, 2, 3 of the count operation according to Embodiments 1, 2 and Examples 1, 2, 3 of the count operation according to Embodiments 3, 4 have been developed in consideration of the renew of the file allocation table (FAT) information. An example which can also handle the data write/erase of a file main body will be described hereinafter.

(1) OTHER EMBODIMENT 1

Figure 15:
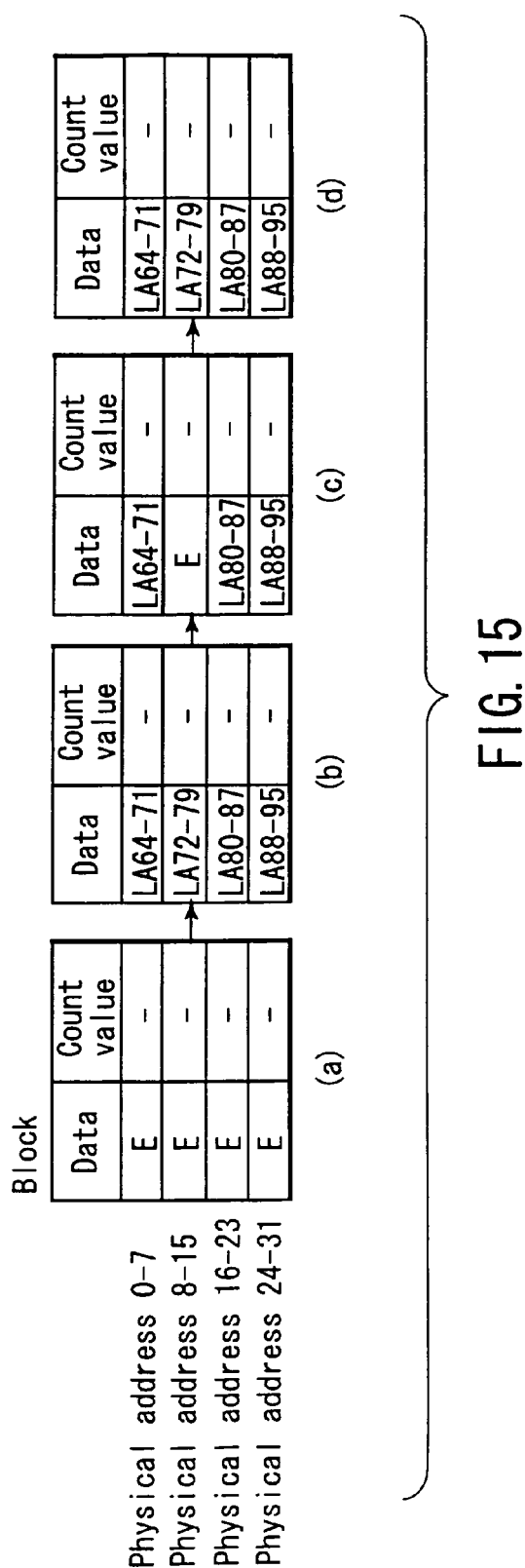
FIG. 15 is a diagram showing an example of another count operation.

FIG. 15 shows the data renew method of the other embodiment 1 of the present invention.

First, as a constitution example of the block, a page size is set to 512 bytes (528 bytes including the redundancy area), and a block size is set to 16 kbytes (excluding the redundancy area). It is assumed that one block is constituted of 32 pages.

The file data is different from the FAT information in the following respects:

① when the renew request of the file data is generated, the old data before the renew becomes unnecessary;

② the file data has a remarkably small frequency of the data renew with respect to the same logic address as compared with the FAT information; and ③ even if the renewed or old data is lost by the page supply breaking, but when the renewed data exists inside the host system, the mortal damage does not occur with respect to the system.

Therefore, it is considered that limited items are relaxed as compared with the renew of the FAT information during the renew of the file data.

In Examples 1, 2, 3 of the count operation according to Embodiments 1, 2 and Examples 1, 2, 3 of the count operation according to Embodiments 3, 4, one block is constituted of four pages, and the data write/erase operation is basically assumed to occur by one page unit. In the present example, it can be considered that one page of the embodiment described above is replaced with a plurality of pages, and the data write/erase operation is collectively performed for a plurality of pages.

In the present example, it is assumed that the data is renewed by the unit of eight pages. The eight pages (physical address) correspond to one square in FIG. 15. Therefore, FIG. 15 is substantially the same as the drawings used in Examples 1, 2, 3 of the count operation according to Embodiments 1, 2 and Examples 1, 2, 3 of the count operation according to Embodiments 3, 4.

(a) Initial State

The memory cells of all the physical addresses (pages) 0 to 7, 8 to 15, 16 to 23, 24 to 31 in the block are in the erase state.

(b) Write

Data LA64 to 71 are written in the physical addresses 0 to 7, data LA72 to 79 (for eight sectors, when one sector is set to 512 bytes) are written in the physical addresses 8 to 15, data LA80 to 87 are written in the physical addresses 16 to 23, and data LA88 to 95 are written in the physical addresses 24 to 31.

(c) and (d) Data Write/Erase of Physical Addresses 8 to 15

The controller 11 outputs the data renew request of the physical addresses 8 to 15 to the memory 10 (see FIG. 4).

The data of the physical addresses 8 to 15 in the block are erased. In the present example, the number of data write/erase times is not managed for each page as seen in the above-described embodiments, and the count value is not read. Thereafter, the renewed data LA72 to 79 are written in the physical addresses 8 to 15.

As described above, in the present example, the number of data write/erase times for each page is not managed. The effects are as follows.

For example, it is assumed that the data renew request is generated with respect to the physical addresses 8 to 15. In this case, in the related art, as described above, the operation is performed comprising: preparing the buffer block in the erase state; copying the data LA64 to LA71, LA80 to LA95 of the physical addresses 0 to 7, 16 to 31 in which the data renew is not necessary into the buffer block; and thereafter executing the block erase for the block which is the object of data write/erase.

That is, in the related-art method, during the data renew, the copy operation occurs with respect to the data LA64 to LA71, LA80 to LA95 which do not have to be renewed, and this lowers a data write/erase rate.

On the other hand, according to the present example, after erasing the pages only of the physical addresses 8 to 15 which are the object of data write/erase, the renewed data LA72 to LA79 may be written in the physical addresses 8 to 15. Therefore, the useless data copy operation is eliminated, and this can raise the data write/erase rate.

Here, the term "page erase" includes the erase in which only one page in the block is the object, and partial erase in which a plurality of pages in the block are collectively erased. Moreover, when the plurality of pages are collectively erased in the block, the pages may be erased once in the partial erase. The pages may be erased one by one a plurality of times (eight times herein). Furthermore, in this case, the pages may also be erased every two pages a plurality of times (four times herein).

Moreover, for example, with a multi-valued flash memory in which one bit line is shared by a plurality of sense amplifiers, when the page erase is physically executed, the data for a plurality of pages is collectively erased as seen from external specifications. Even in this case, instead of erasing all the pages in the block, only some of the pages are erased. From this viewpoint, the erase is equivalent to the present-example erase.

In fields such as a digital camera in which the flash memory card is frequently used, in many cases, a use method comprises: performing photographing for the capacity of the memory card; transferring an image to the systems such as the personal computer; and subsequently erasing all image files. In this case, the number of data write/erase times is also limited with respect to the flash memory, and concentrated write/erase does not occur in the area of the file main body.

Therefore, in the file data, as in the present example, even if the number of data write/erase times for each page is not managed, a practical problem is not generated. The present example is effective in this field.

It is to be noted that also for the renew of the file data, the number of data write/erase times may also naturally be managed as described in Examples 1, 2, 3 of the count operations according to Embodiments 1, 2, 3, 4.

An embodiment will be described hereinafter in which the number of data write/erase times is managed during the renew of the file data.

(2) OTHER EMBODIMENT 2

Figure 16:
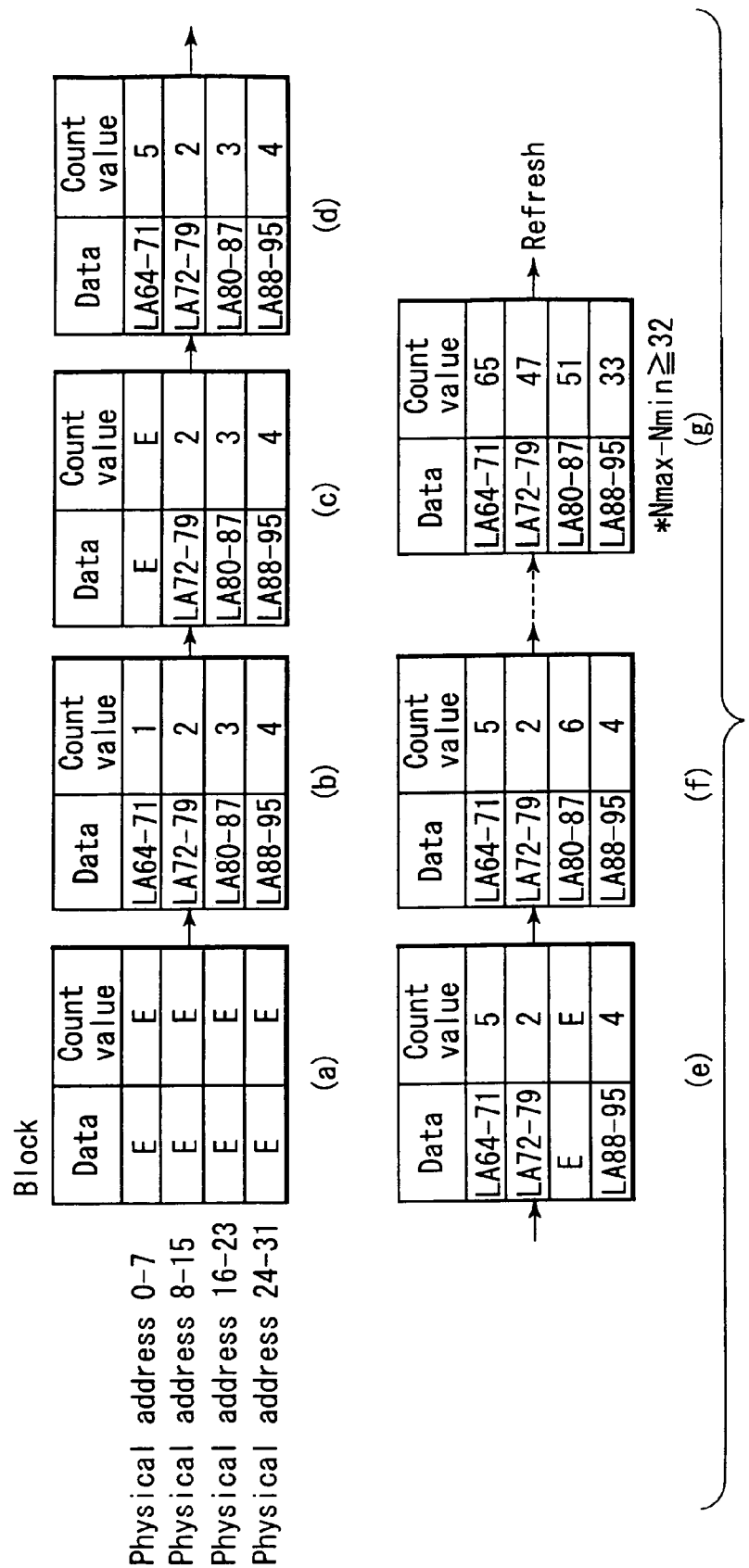
FIG. 16 is a diagram showing the example of the other count operation.
Figure 17:
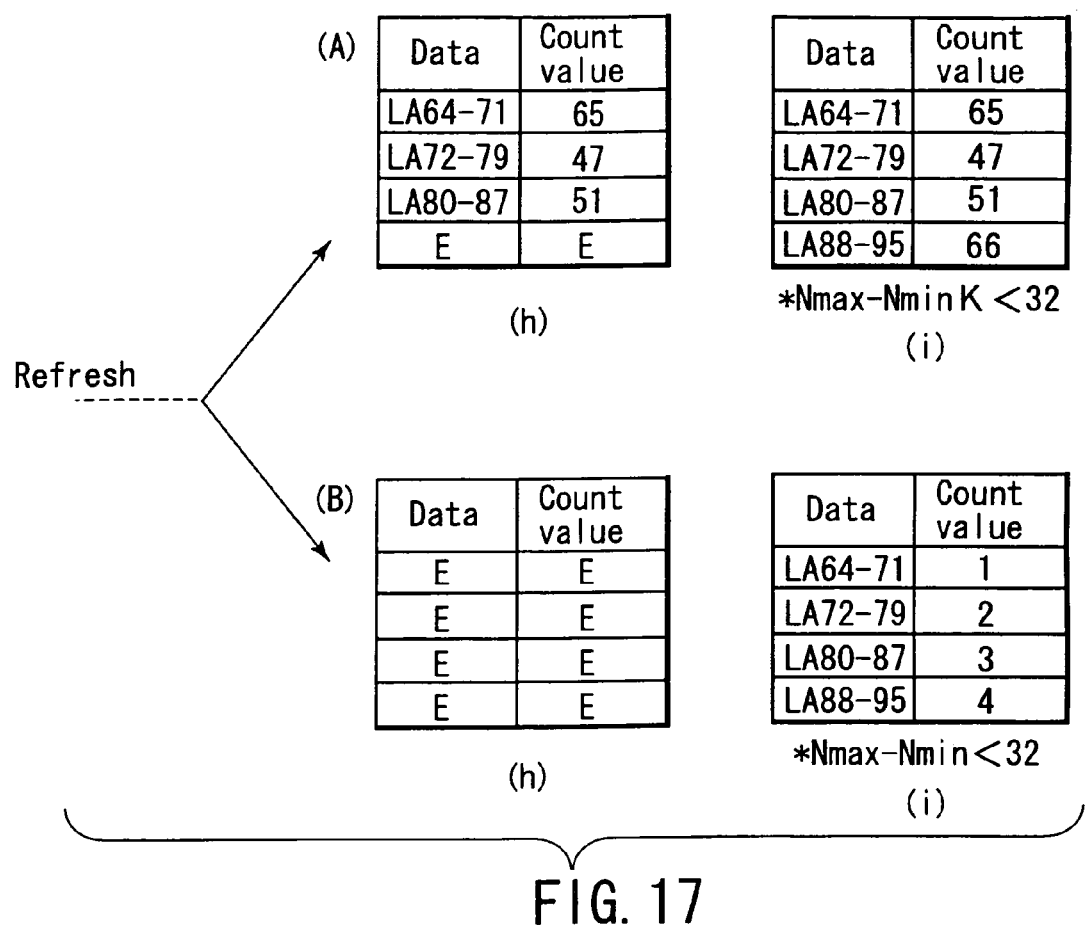
FIG. 17 is a diagram showing the example of the other count operation.

FIGS. 16 and 17 show the data renew method according to the other embodiment 2 of the present invention.

The data renew method and count method of the present example are the same as the method (see FIG. 9) of Example 3 of the count operation according to Embodiments 1, 2. Additionally, in the present example, one page in Example 3 of the count operation according to Embodiments 1, 2 is replaced with a partial erase unit (referred to as "one area"). That is, in the present example, one area is a minimum unit of erase including a plurality of pages.

(a) Initial State

The memory cells of all the areas in the block, that is, physical addresses (pages) 0 to 31 are in the erase state.

(b) Write

First, the data LA64 to 71 are written in the physical addresses (one area) 0 to 7 (for eight sectors, when one sector is set to 512 bytes). Similarly, the data LA72 to 79 are written in the physical addresses (one area) 8 to 15, data LA80 to LA87 are written in the physical addresses (one area) 16 to 23, and the data LA88 to LA95 are written in the physical addresses (one area) 24 to 31.

At the write time of the data LA64 to LA71 with respect to the physical addresses 0 to 7, "1" is written as the count value of the physical addresses 0 to 7, that is, the number of data write/erase times. Moreover, at the write time of the data LA72 to LA79 with respect to the physical addresses 8 to 15, the second data write/erase is performed as seen in the whole block. Therefore, "2" is written as the count value, that is, the number of data write/erase times of the physical addresses 8 to 15.

Similarly, at the write time of the data LA80 to LA87 with respect to the physical addresses 16 to 23, the third data write/erase is performed as seen in the whole block. Therefore, "3" is written as the count value, that is, the number of data write/erase times of the physical addresses 16 to 23. Moreover, at the write time of the data LA88 to LA95 with respect to the physical addresses 24 to 31, the fourth data write/erase is performed as seen in the whole block. Therefore, "4" is written as the count value, that is, the number of data write/erase times of the physical addresses 24 to 31.

(c) and (d) Data Write/Erase of Physical Addresses 0 to 7

The controller 11 outputs the data renew request of the physical addresses 0 to 7 to the memory 10 (see FIG. 4).

First, the count values of all the physical addresses 0 to 7, 8 to 15, 16 to 23, 24 to 31 in the block are read. The controller 11 of FIG. 4 selects the maximum value Nmax from the count values of the physical addresses 0 to 7, 8 to 15, 16 to 23, 24 to 31. At this time, the count value "4" of the physical addresses 24 to 31 has the largest value. The controller 11 of FIG. 4 adds "1" to the count value "4" of the physical addresses 24 to 31, and sets the count value "5" as the count value of the physical addresses 0 to 7 which are the object of data write/erase. The count values of the physical addresses 0 to 7, 8 to 15, 16 to 23, 24 to 31 are temporarily stored, for example, in the memory (RAM, and the like) in the controller 11 of FIG. 4.

Thereafter, the data LA64 to LA71 and count values stored in the physical addresses 0 to 7 are erased (see (c)). Subsequently, the renewed data LA64 to 71 and count values (="5") are written in the physical addresses 0 to 7 (see (d)).

Moreover, the controller 11 of FIG. 4 extracts the maximum value Nmax and minimum value Nmin from the count values of the physical addresses 0 to 7, 8 to 15, 16 to 23, 24 to 31. Subsequently, the controller calculates the difference between the maximum value Nmax and minimum value Nmin and judges whether or not the difference reaches the maximum value (allowable value) of the number of data write/erase times, that is, "32".

At this time, the count value "5" of the physical addresses 0 to 7 is largest, and the count value "2" of the physical addresses 8 to 15 is smallest. Therefore, the maximum value Nmax−minimum value Nmin is "3", and this numeric value is smaller than "32".

Therefore, at this time, the refresh operation is not performed.

(e) and (f) Data Write/Erase of Physical Address 2

The controller 11 outputs the data renew request of the physical addresses 16 to 23 to the memory 10 (see FIG. 4).

First, the count values of all the physical addresses 0 to 7, 8 to 15, 16 to 23, 24 to 31 in the block are read. The controller 11 of FIG. 4 selects the maximum value Nmax from the count values of the physical addresses 0 to 7, 8 to 15, 16 to 23, 24 to 31. At this time, the count value "5" of the physical addresses 0 to 7 has the largest value. The controller 11 of FIG. 4 adds "1" to the count value "5" of the physical addresses 0 to 7, and sets the count value "6" as the count value of the physical addresses 16 to 23 which are the objects of data write/erase. The count values of the physical addresses 0 to 7, 8 to 15, 16 to 23, 24 to 31 are temporarily stored, for example, in the memory (RAM, and the like) in the controller 11 of FIG. 4.

Thereafter, the data LA80 to LA87 and count values stored in the physical addresses 16 to 23 are erased (see (e)). Subsequently, the renewed data LA80 to LA87 and count values (="6") are written in the physical addresses 16 to 23 (see (f)).

Moreover, the controller 11 of FIG. 4 extracts the maximum value Nmax and minimum value Nmin from the count values of the physical addresses 0 to 7, 8 to 15, 16 to 23, 24 to 31. Subsequently, the controller calculates the difference between the maximum value Nmax and minimum value Nmin and judges whether or not the difference reaches the maximum value (allowable value) of the number of data write/erase times, that is, "32".

At this time, the count value "6" of the physical addresses 16 to 23 is largest, and the count value "2" of the physical addresses 8 to 15 is smallest. Therefore, the maximum value Nmax−minimum value Nmin is "4", and this numeric value is smaller than "32".

Therefore, at this time, the refresh operation is not performed.

(g) Refresh

Following the data renew request, the operations similar to the above-described operations of (c) and (d), or (e) and (f) are executed, and finally the count values of the physical addresses 0 to 7, 8 to 15, 16 to 23, 24 to 31 are assumed as in (g).

The controller 11 of FIG. 4 extracts the maximum value Nmax and minimum value Nmin from the count values of the physical addresses 0 to 7, 8 to 15, 16 to 23, 24 to 31. The maximum value Nmax is the count value of the physical addresses 0 to 7, and the value is "65". Moreover, the minimum value Nmin is the count value of the physical addresses 24 to 31, and the value is "33". The difference between the maximum value Nmax and minimum value Nmin is "32".

That is, after the data of the physical addresses 24 to 31 are finally renewed, the physical addresses 24 to 31 undergo the voltage stress by 32 (=65−33) data write/erase times. Therefore, the controller 11 of FIG. 4 confirms this fact, and gives the command to perform the refresh operation to the memory 10 of FIG. 4.

In the present example, the necessity of the refresh operation is judged based on the difference between the maximum value Nmax and minimum value Nmin of the count values of the respective physical addresses 0 to 7, 8 to 15, 16 to 23, 24 to 31 in the block. Therefore, when the difference is less than the allowable value, it is not necessary to perform the refresh operation. As the case may be, without performing any refresh operation, the data write/erase operation can continuously be performed.

Moreover, in the present example, since the necessity of the refresh operation is judged based on the difference between the maximum value Nmax and minimum value Nmin of the count values, the condition of refresh does not depend on the initial state of the memory. Moreover, in the present example, it is unnecessary to assume the worst case and set the condition of refresh.

In the refresh operation, the data stored in the data area is rewritten and thereby refreshed, but the count value of the redundancy area is initialized, for example, in the state of (b) at the refresh operation time. That is, as shown in (h) and (i) of (B) of FIG. 17, in the write operation in the refresh, the count values "1", "2", "3", "4" are written in the redundancy areas corresponding to the physical addresses 0 to 7, 8 to 15, 16 to 23, 24 to 31, respectively.

It is to be noted that in the present example, when the above-described refresh condition (Nmax−Nmin≧32) is satisfied, only the physical addresses 24 to 31 having the count value indicating the minimum value Nmin may also be refreshed. In this case, as shown in (h) and (i) of (A) of FIG. 17, after the refresh operation, only the count values of the physical addresses 24 to 31 which are the object of refresh are renewed, and the other count values are continuously counted as such without being initialized.

For example, in the example of (h) and (i) of FIG. 17(A), by the refresh operation of the physical addresses LA24 to 31, the count values of the physical addresses LA24 to 31 may also be set to "66" (=65+1). Since the physical addresses 0 to 7, 8 to 15, 16 to 23 are not refreshed, the present states of the count values are maintained.

In this manner, in the present example, the number of data write/erase times is stored for each area. Every time the data write/erase request is generated, the maximum value Nmax and minimum value Nmin of the number of data write/erase times (count value) are extracted, and the necessity of the refresh operation is judged with the difference. The advantage of the present example lies in that when the difference between the maximum and minimum values is less than the allowable value, the data write/erase operation can continuously be performed without executing the refresh operation.

It is to be noted that for each page constituting the area, the number of data write/erase times may also be managed. This is because the size of the area in the block does not have to be necessarily fixed, and may be variable. For example, when the size of the area is fixed, the number of data write/erase times may be managed by an area unit. However, when the size of the area is variable, it is convenient to manage the number of data write/erase times for each page in the area.

For the refresh method, as described above, various methods can be employed. For example, a method can be employed comprising: temporarily saving the data of the area which is the object of refresh in the buffer in the system; thereafter erasing the data of the area; and finally returning the data again to the area from the buffer in the system. Moreover, two blocks are used in the pair, and the data of the area which is the object of refresh may be moved to another block.

The embodiment in consideration of the file main body has been described above. This example corresponds to Example 3 of the count operation according to Embodiments 1, 2, but may naturally correspond, for example, to Examples 1, 2 of the count operation according to Embodiments 1, 2 and Examples 1, 2, 3 of the count operation according to Embodiments 3, 4.

(3) OTHER EMBODIMENT 3

Figure 18:
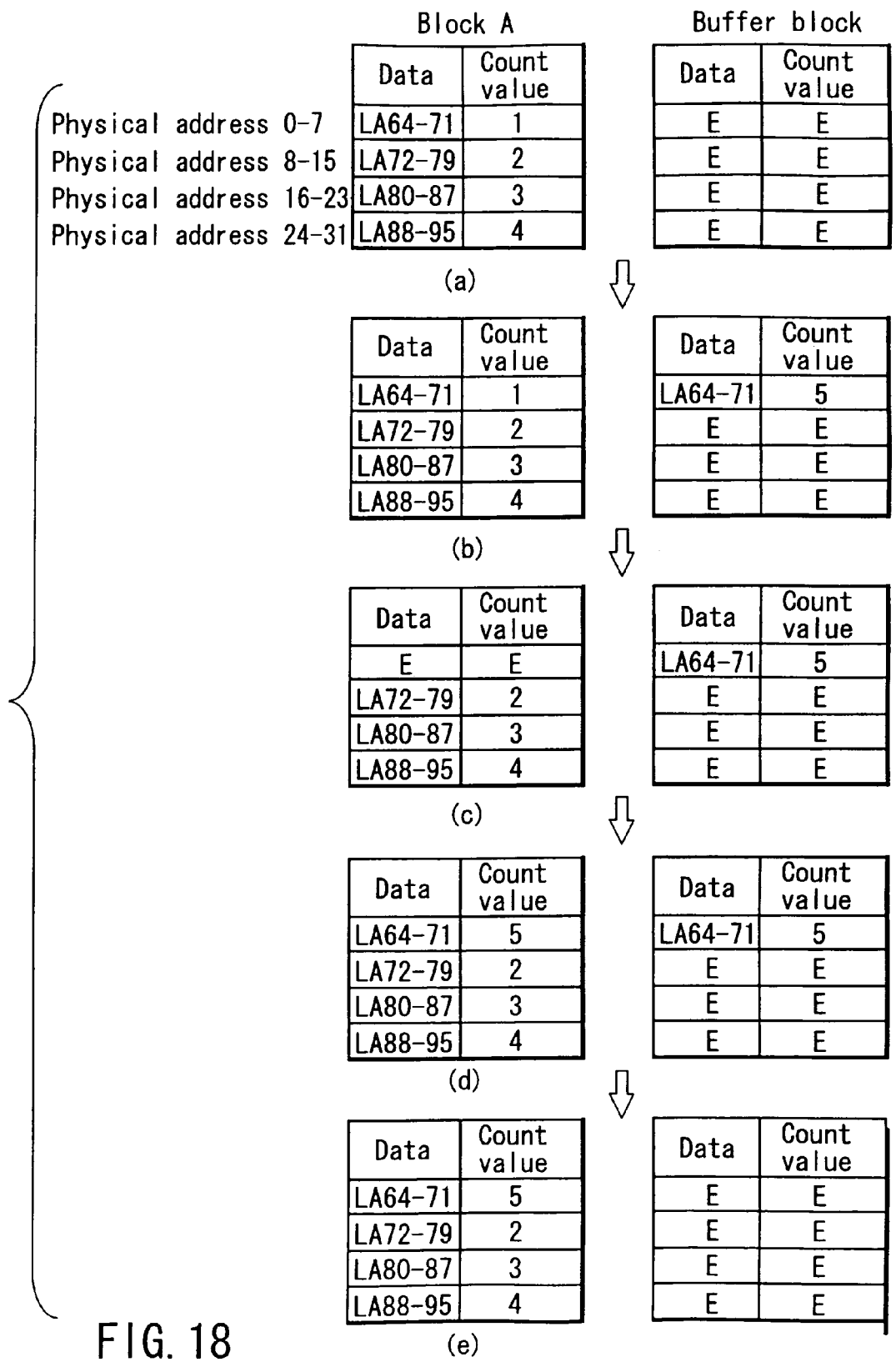
FIG. 18 is a diagram showing the example of the other count operation.
Figure 19:
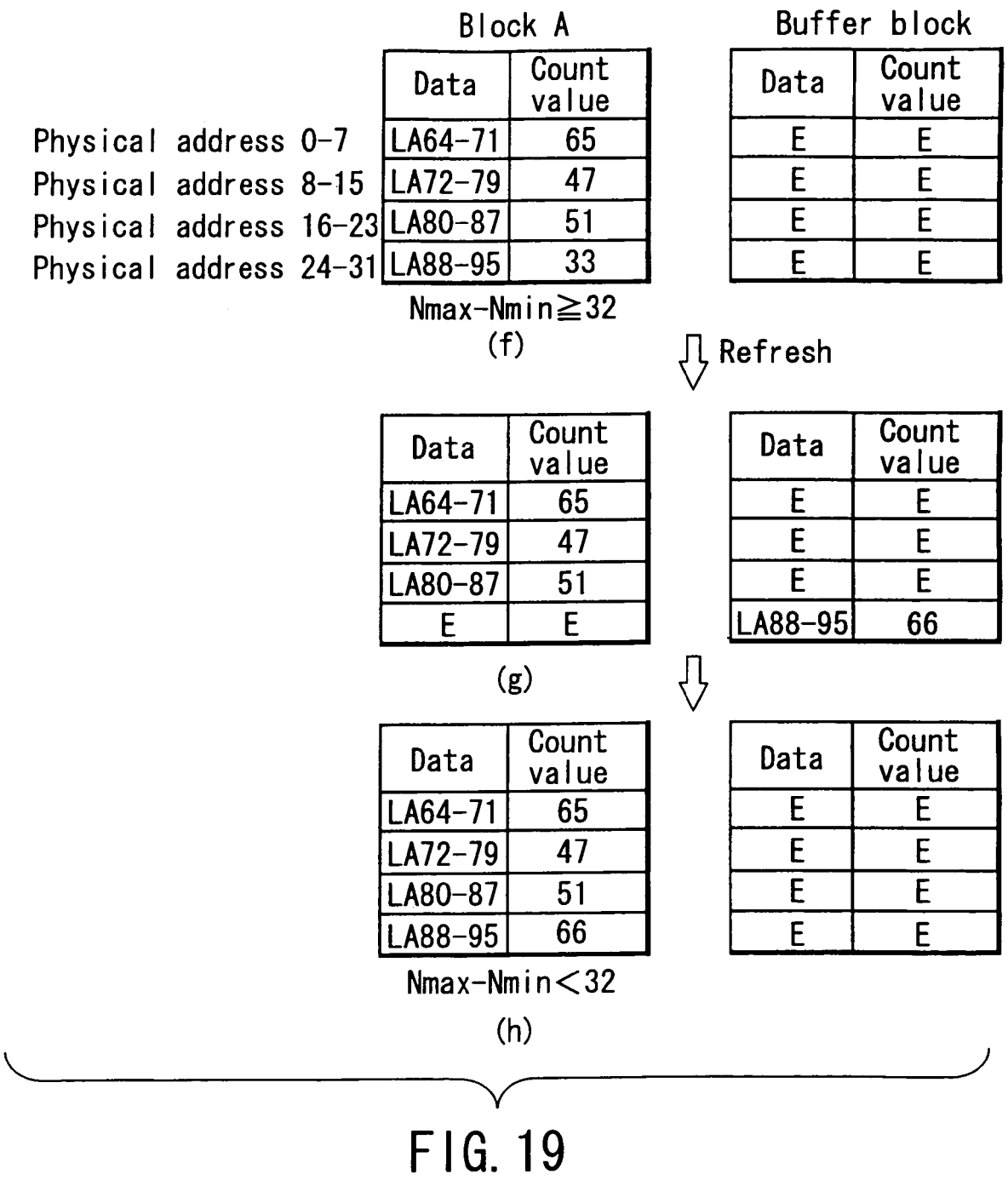
FIG. 19 is a diagram showing the example of the other count operation.

FIGS. 18 and 19 show the data renew method according to the other embodiment 3 of the present invention.

A basic algorism is the same as that of Example 3 (see FIG. 14) of the count operation according to Embodiments 3, 4. In the present example, another block of the NAND-type flash memory is used as the buffer for temporarily storing the data at the data renew time. Here, the block for storing the data is set to the block A, and the block for temporarily storing the data is set to the buffer block.

(a) Initial State

The state of the block A is as follows.

The data LA64 to LA71 (for eight sectors, when one sector is set to 512 bytes) are stored in the physical addresses (one area) 0 to 7. Similarly, the data LA72 to LA79 are stored in the physical addresses (one area) 8 to 15, data LA80 to LA87 are stored in the physical addresses (one area) 16 to 23, and data LA88 to 95 are stored in the physical addresses (one area) 24 to 31.

The count value of the physical addresses 0 to 7, that is, the number of data write/erase times is "1". Moreover, the count value of the physical addresses 8 to 15, that is, the number of data write/erase times is "2". Similarly, the count value of the physical addresses 16 to 23, that is, the number of data write/erase times is "3", and the count value, that is, the number of data write/erase times of the physical addresses 24 to 31 is "4".

For the buffer block, all the physical addresses 0 to 7, 8 to 15, 16 to 23, 24 to 31 are set to the erase state.

(b) to (e) Data Write/Erase of Physical Addresses 0 to 7

The controller 11 outputs the data renew request of the physical addresses 0 to 7 to the memory 10 (see FIG. 4).

First, the count values of all the physical addresses 0 to 7, 8 to 15, 16 to 23, 24 to 31 in the block A are read. Moreover, in the controller 11 of FIG. 4, the count values of the physical addresses 0 to 7 are renewed.

For example, the controller 11 of FIG. 4 selects the maximum value Nmax from the count values of the physical addresses 0 to 7, 8 to 15, 16 to 23, 24 to 31. At this time, the count value "4" of the physical addresses 24 to 31 has the largest value. The controller 11 of FIG. 4 adds "1" to the count value "4" of the physical addresses 24 to 31, and sets the count value "5" as the count value of the physical addresses 0 to 7 which are the objects of data write/erase.

Subsequently, the renewed data LA64 to 71 and count value "5" of the physical addresses 0 to 7 are stored in the physical addresses 0 to 7 in the buffer block (see (b)).

Thereafter, the data LA64 to LA71 and count values stored in the physical addresses 0 to 7 in the block A are erased (see (c)). Subsequently, the renewed data LA64 to LA71 and count value "5" are written in the physical addresses 0 to 7 in the block A (see (d)). Moreover, the data LA64 to LA71 and count values stored in the physical addresses 0 to 7 in the buffer block are erased (see (e)).

Subsequently, the controller 11 of FIG. 4 judges whether or not the maximum value Nmax-minimum value Nmin reaches the allowable value "32" based on the count values of the physical addresses 0 to 7, 8 to 15, 16 to 23, 24 to 31. At this time, the count value "5" of the physical addresses 0 to 7 is largest, and the count value "2" of the physical addresses 8 to 15 is smallest, but the difference does not reach the allowable value "32".

Therefore, at this time, the refresh operation is not performed.

This operation is repeated. When the count values of the physical addresses 0 to 7, 8 to 15, 16 to 23, 24 to 31 in the block A satisfy the refresh condition, the refresh operation is executed. According to the present example, the renewed data and count value are constantly stored in either one of the block A and buffer block. For example, even when the emergency situations such as the abrupt breaking of the power supply occur, the mortal damage in the system can be avoided.

It is assumed that the data and count value in the block A are finally as shown in (f) of FIG. 19. In (f), the count values of the physical addresses 24 to 31 are smallest and oldest. On the other hand, the count values of the physical addresses 0 to 7 are largest and newest. The difference between both means that after finally renewing the data of the physical addresses 24 to 31 (33rd time), the memory cells of the physical addresses 24 to 31 undergo the voltage stress caused by 32 (=65−33) data write/erase times. Therefore, at this time, the necessity of the refresh operation is generated.

As described above, in the present example, the maximum value Nmax and minimum value Nmin of the number of data write/erase times of each area in the block are extracted, and the necessity of the refresh operation is judged with the difference. The advantage of the present example lies in that the data write/erase can continuously be performed without executing any refresh operation, as long as the difference between the maximum value Nmax and minimum value Nmin is less than the allowable value.

Moreover, in the present example, since the necessity of the refresh operation is judged based on the difference between the maximum value Nmax and minimum value Nmin of the count values, the condition of refresh does not depend on the initial state of the memory. Moreover, in the present example, it is unnecessary to assume the worst case and set the condition of refresh.

In the refresh operation, the data stored in the data area is rewritten and thereby refreshed, but the count value of the redundancy area is initialized, for example, in the state of (b) at the refresh operation time. That is, in the write operation in the refresh, the count values "1", "2", "3", "4" are written in the redundancy areas corresponding to the physical addresses 0 to 7, 8 to 15, 16 to 23, 24 to 31, respectively.

Moreover, in the present example, when the above-described refresh condition (Nmax−Nmin≧32) is satisfied, only the physical addresses 24 to 31 having the count value indicating the minimum value Nmin may also be refreshed. In this case, as shown in (f) and (g) of FIG. 19, after the refresh operation, only the count values of the physical addresses 24 to 31 which are the objects of refresh are renewed, and the other count values are continuously counted as such without being initialized.

For example, in the example of (f) and (g) of FIG. 17, by the refresh operation of the physical addresses 24 to 31, the count values of the physical addresses LA24 to 31 may also be set to "66" (=65+1). Since the physical addresses 0 to 7, 8 to 15, 16 to 23 are not refreshed, the present state of the count value is maintained.

It is to be noted that the number of data write/erase times may also be managed for each page constituting the area. This is because the size of the area in the block does not have to be necessarily fixed, and may also be variable. For example, when the size of the area is fixed, the number of data write/erase times may be managed by the area unit. However, when the size of the area is variable, it is convenient to manage the number of data write/erase times for each page in the area.

For the refresh method, as described above, various methods can be employed. In the present example, as shown in (g) and (h) of FIG. 19, the method is employed comprising: temporarily saving the data of the area which is the object of refresh in the buffer block; thereafter erasing the data of the area; returning the data again to the area from the buffer in the system; and finally erasing the data of the buffer block.

In the other embodiments 1, 2, 3, the area constituted of a plurality of pages is defined, and it is basically assumed that the renew of the data of the same size (capacity) as that of the area occurs. However, in the usual system, the renew of the data having a size smaller than that of the area occurs in some case.

In this case, the data which is not renewed in the area is saved, for example, in the buffer in the system, another block (buffer block), and the like, and written back in the original block together with the renewed data. Moreover, when two blocks are used in the pair, and the data is alternately written in the blocks, in the write operation with respect to one block, the renewed data, and non-renewed data read from the other block are written.

This can also apply to a case in which the renew of the data having a size smaller than that of the page occurs, for example, in Examples 1, 2, 3 of the count operation according to Embodiments 1, 2 and Examples 1, 2, 3 of the count operation according to Embodiments 3, 4.

(4) OTHER EMBODIMENT 4

Figure 20:
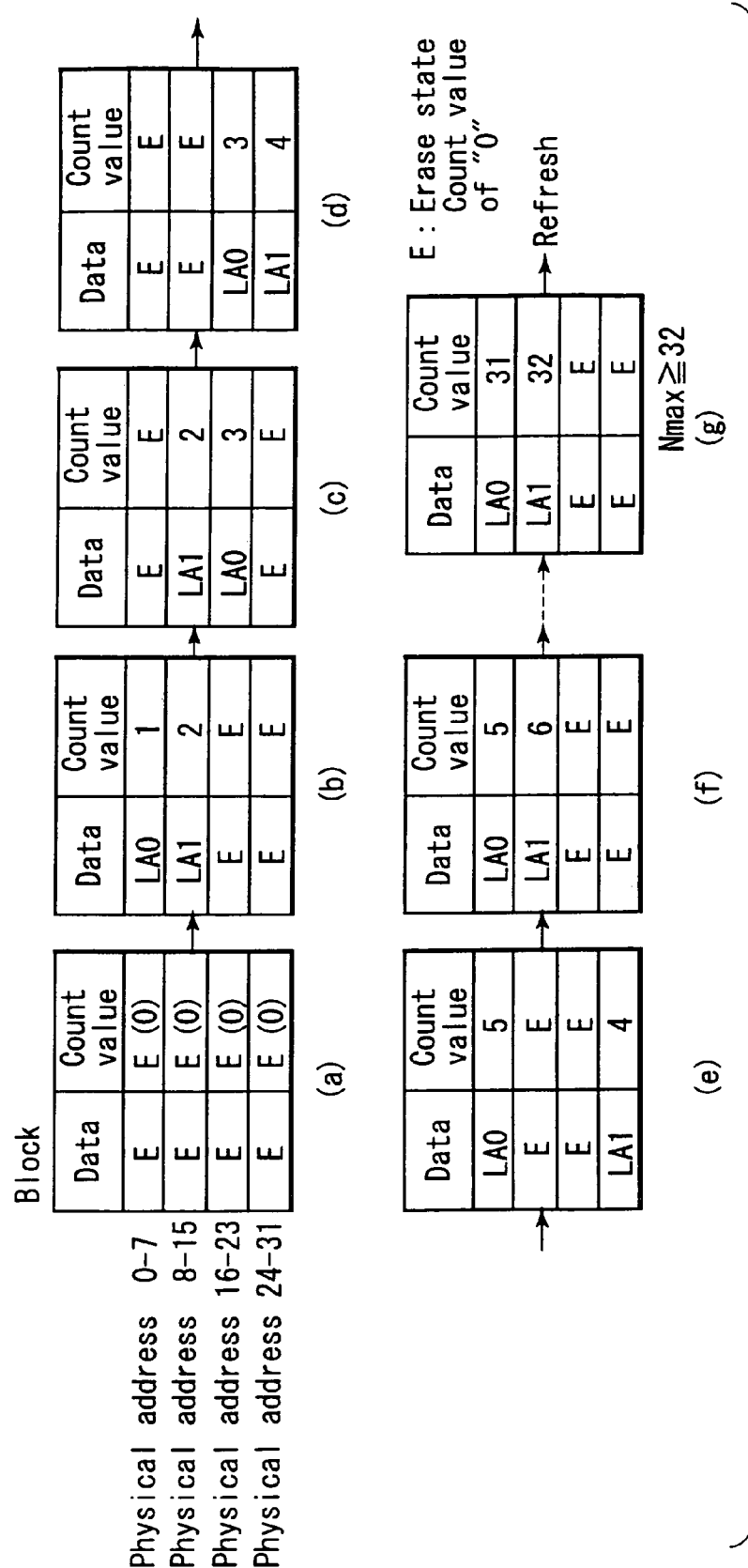
FIG. 20 is a diagram showing the example of the other count operation.
Figure 21:
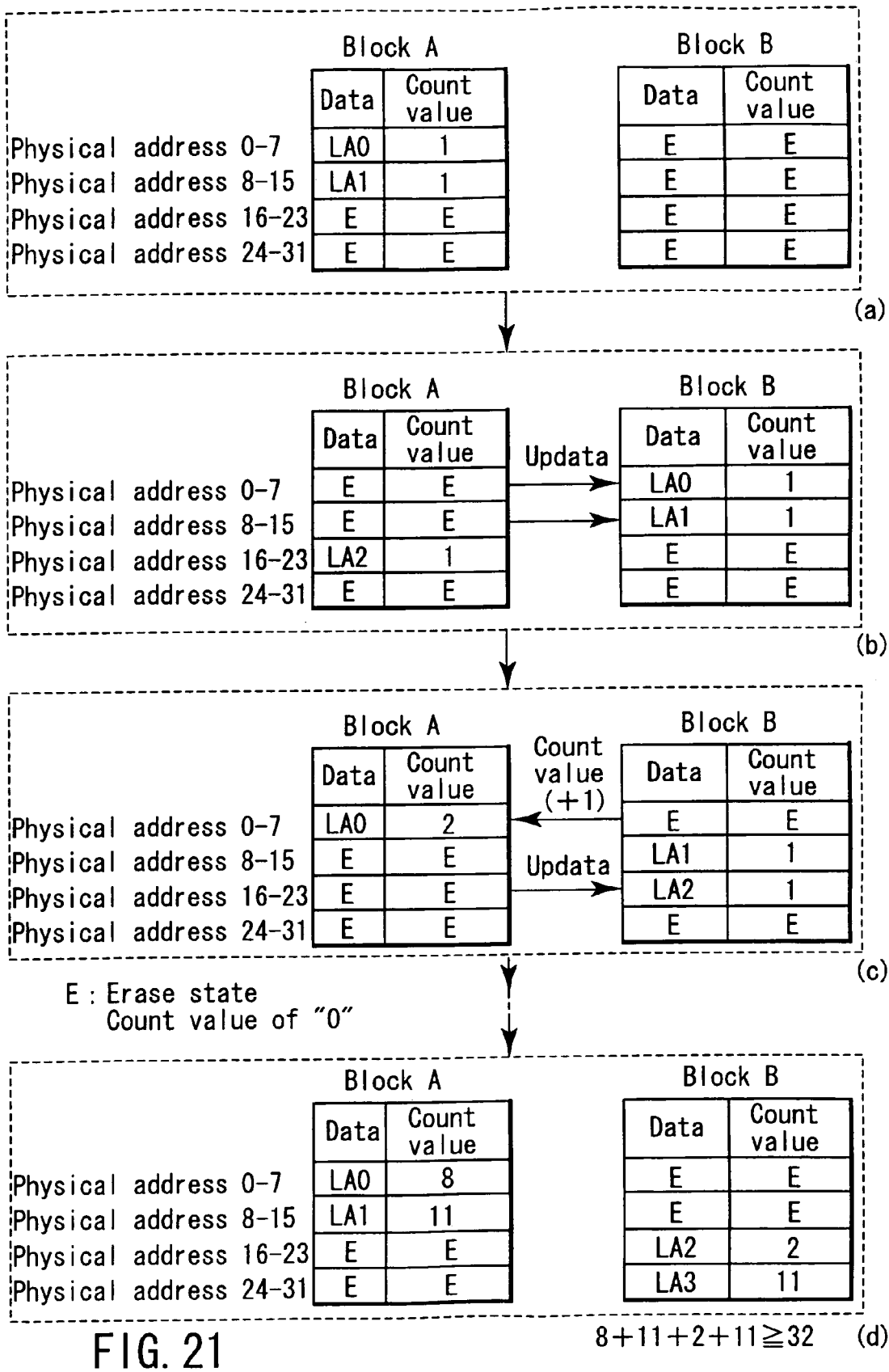
FIG. 21 is a diagram showing the example of the other count operation.
Figure 22:
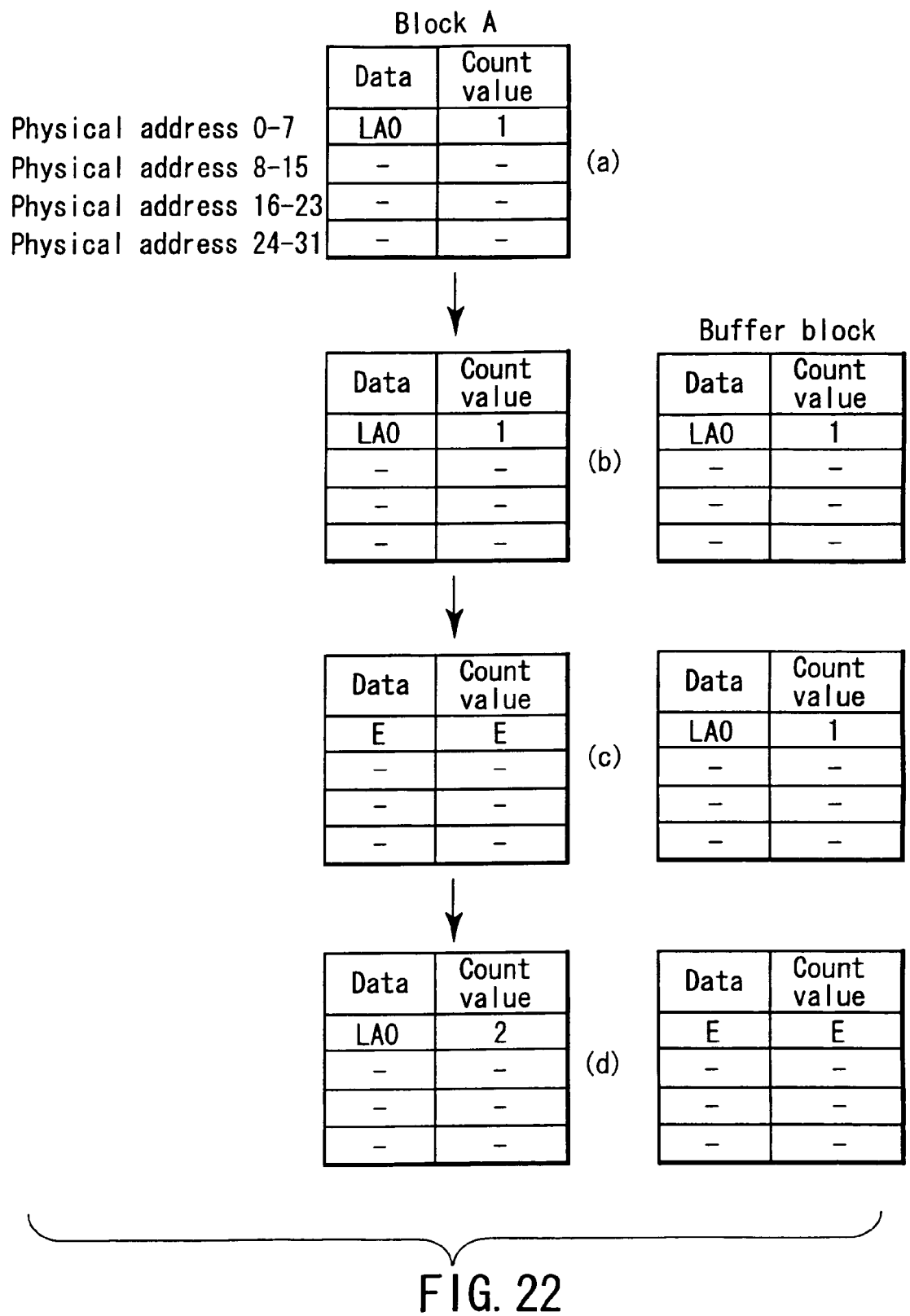
FIG. 22 is a diagram showing the example of the other count operation.

FIGS. 20 to 22 show the data renew method according to the other embodiment 4 of the present invention.

The data renew method and count method of the present example are a modification example of the data renew method and count method of FIGS. 12 to 14. In the present example, one page in FIGS. 12 to 14 is replaced with the partial erase unit, that is, one area. In the present example, one area includes a plurality of pages, and forms the minimum unit of erase.

11. Others

The count value indicating the number of data write/erase times (may also be erase or write times) for each page or area is usually stored in the redundancy area existing in the same page as the page in which the data is stored. However, the count value may also be stored in the portion other than the redundancy area existing in the same page as the page in which the data is stored.

For example, a memory area in which the number of data write/erase times for each page or area is managed in a concentrated manner is disposed in the flash memory, and the number of data write/erase times may also be managed in the memory area. Moreover, when a conversion table of the logic and physical addresses is disposed in the flash memory, the number of data write/erase times may also be managed as an element constituting the table.

The example of the present invention is mainly applied to the renew of the user data, that is, the data of the file main body in the personal computer, file management information (FAT table information, directory information), and the like. However, in the example of the present invention, the example is not limited to the renew of the user data, and can also be applied to the renew of the data which is not directly related with the user data, such as the renew of management information for use inside the flash memory card.

Examples of the management information for use in the card include conversion table information of the logic and physical addresses, attribute and renew information of the card, write protect information, information related with security of passwords, management information of a defective block of an incorporated flash memory, information such as the number of data write/erase times of the flash memory, control firmware of a controller inside the flash memory card, and the like.

It is possible to combine and use the example of the present invention with the related-art data write/erase by the block unit. For example, the data of the main body of the file in which a write request is issued by a relatively large unit such as a cluster unit is handled by the data write/erase of the related-art block unit. The FAT data, directory information, and the like in which the write request is issued by the relatively small unit are handled by the data write/erase using the page erase according to the example of the present invention.

In this case, a function of analyzing a data structure is added to the controller. The renew of the FAT data or directory (including sub-directory information) may also be started by the algorithm according to the example of the present invention. Moreover, FAT or directory information is judged within the range of the preset logic address, and may be started by the algorithm of the present invention.

In the above-described embodiments, the NAND-type flash memory in which the page size of the flash memory is 512 bytes (excluding the redundancy area) has been described as the example. However, with enlargement of the memory capacity in recent years, a flash memory in which the page size is 2 kilobytes, flash memory in which the data is simultaneously written in a plurality of pages, and the like have been developed.

The example of the present invention can also be applied to such new flash memory in recent years. For example, the present invention can also be applied to a NAND-type flash memory in which the page size is two kilobytes, one block includes 64 pages, the block size is 128 kilobytes, and the size of the partial erase (erase unit) in the block is 16 kilobytes.

In this case, as the external specifications, the data for eight pages is collectively erased. However, with a binary flash memory in which one bit line is shared by two sense amplifiers, the data for four pages is physically erased.

In actual, the erase operation comprises: setting the word line (control gate electrode) of the page which is the object of erase to the ground level; and setting the substrate to the high potential (e.g., about 20 V). At this time, since a large potential difference is generated between the floating gate electrode and substrate, charges of the floating gate electrode are discharged by FN tunneling phenomenon, and the data of the memory cell is erased.

The word line of the page which is not the object of erase is set, for example, to the same potential (e.g., about 20 V) as that of the substrate. Therefore, in the page which is not the object of erase, the large potential difference is not generated between the floating gate electrode and substrate, and the data of the memory cell is not erased.

The example of the present invention is not limited to the page size of 2 kilobytes, and can be applied to the flash memory having an arbitrary size.

Figure 23:
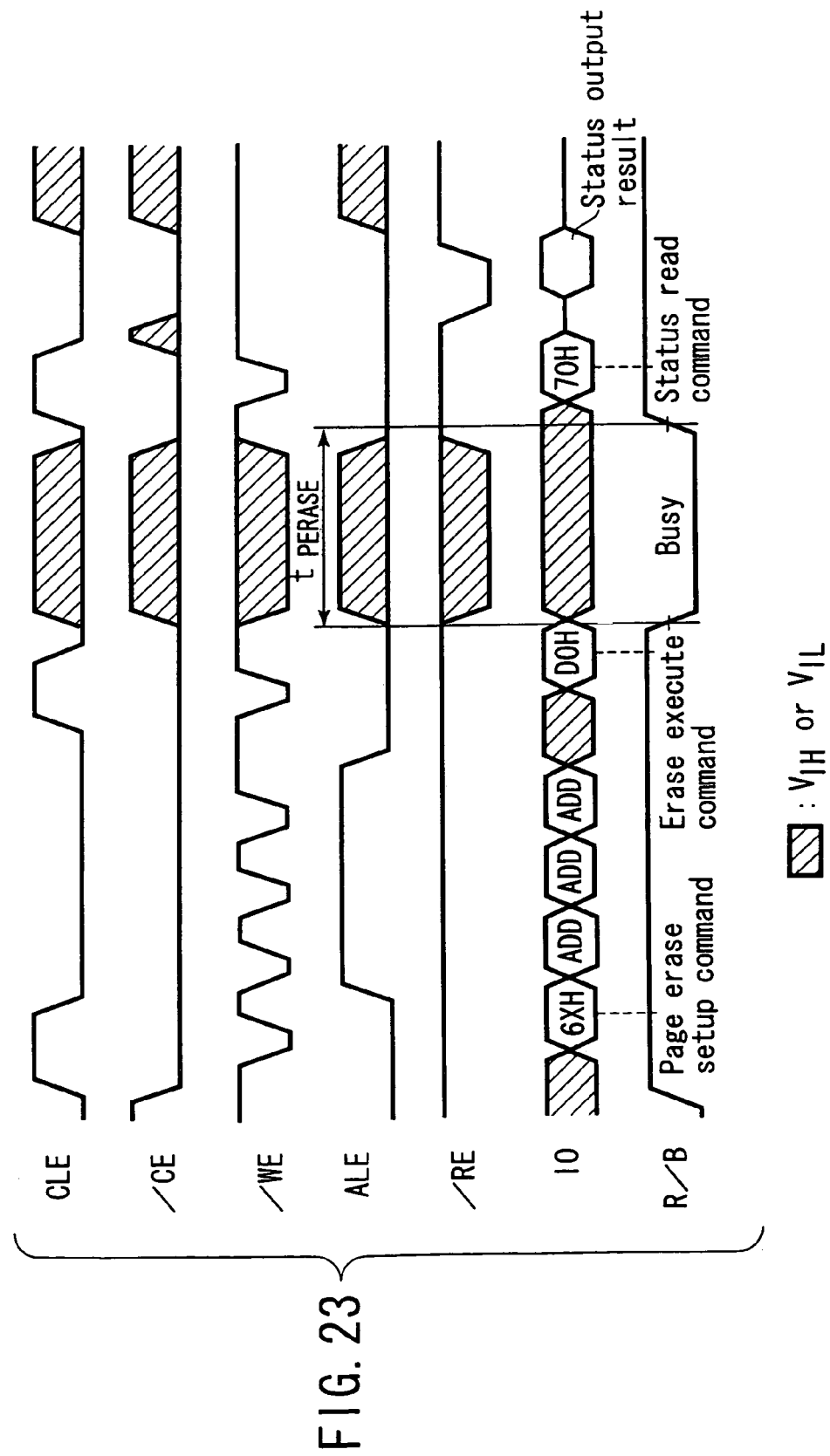
FIG. 23 is a waveform diagram showing a generation example of a command at a page erase time.

FIG. 23 shows a generation example of the command at the page erase time of the NAND-type flash memory.

The block erase, page erase, and partial erase in the block in which a plurality of pages are simultaneously erased are divided by different command codes, respectively.

Figure 24:
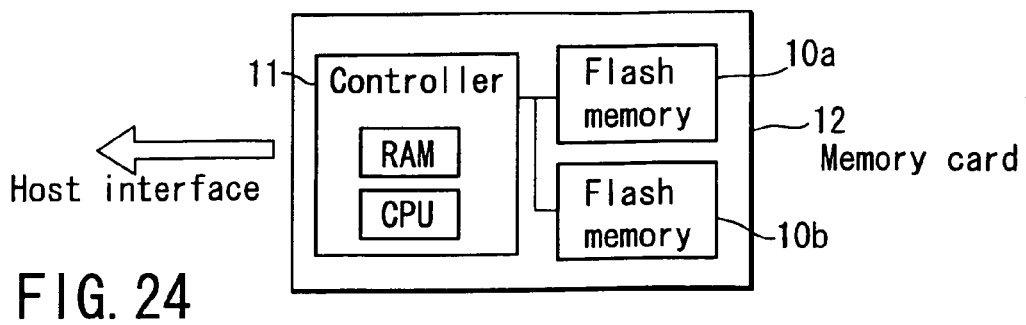
FIG. 24 is a diagram showing an example of a memory card to which the example of the present invention is applied.
Figure 25:
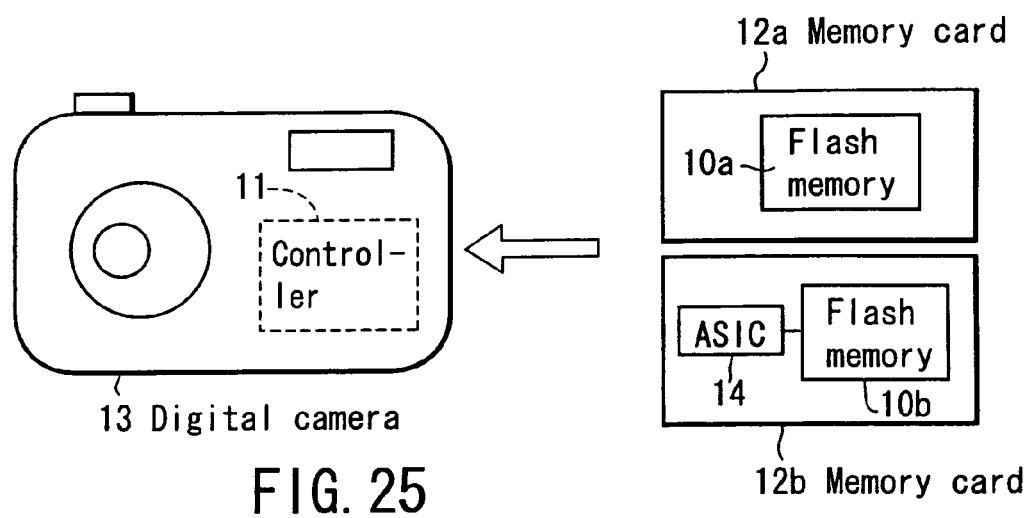
FIG. 25 is a diagram showing an example of a system to which the example of the present invention is applied.
Figure 26:
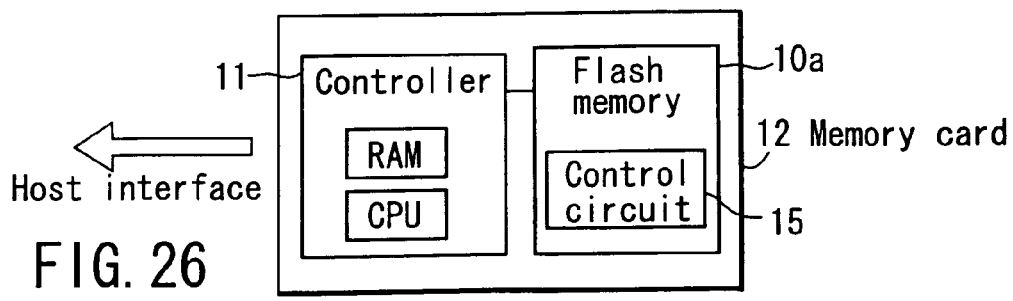
FIG. 26 is a diagram showing an example of the memory card to which the example of the present invention is applied.

FIGS. 24 to 26 show the system example to which the example of the present invention is applied.

The example of FIG. 24 relates to the memory card which includes the controller and flash memory.

In a memory card 12, the controller 11 and a plurality of flash memories 10a, 10b are mounted. The controller 11 includes RAM and CPU. As a host interface, various interfaces such as an ATA interface, PC card interface, and USB are considered, and the example of the present invention can be applied to any interface.

In the present example, the controller (a microcomputer is generally mounted) 11 in the memory card 12 controls a data renew operation according to the example of the present invention, count method, transfer conditions to refresh, and the like. That is, the controller 11 generates the command for the page erase and partial erase in the block, and these commands are given to the flash memories 10a, 10b.

It is to be noted that the controller 11 and flash memories 10a, 10b may be formed in one chip or separate chips.

The example of FIG. 25 relates to the memory card on which the controller is not mounted.

In the present example, a card 12a on which only the flash memory 10a is mounted, or card 12b on which a relatively small-sized logic circuit (ASIC) 14 is mounted are objects. In this case, for example, when an apparatus connected to the cards 12a, 12b on a host side is assumed to a digital camera 13, the controller for flash memory card control 11 disposed in the digital camera 13 supplies the command for the page erase or partial erase in the block to the flash memories 10a, 10b in the cards 12a, 12b.

The example of FIG. 26 relates to the flash memory on which a control circuit to perform all or part of the control according to the example of the present invention is mounted.

The controller 11 and flash memory 10 are mounted on the memory card 12. The flash memory 10 includes, for example, a control circuit 15 which generates information associated with the number of data write/erase times of the page. The flash memory 10 prepares such information by the control circuit 15, and stores this information, for example, in the redundancy area (storage area of an error correction code, and the like) of the memory cell array. A function with which information associated with the number of data write/erase times of the page can be referred to from the outside may also be added to the flash memory 10.

The information associated with the number of data write/erase times of the page may also be stored in a special memory cell area which cannot directly be referred to from the outside of the flash memory. In this case, by a specific command, the information may also be read to the outside, or information on whether or not the refresh condition is satisfied may also be read to the outside.

The control circuit 15 in the flash memory 10 may include a function of returning information indicating whether or not the page erase is possible, whether or not the page erase has normally been performed, or whether or not the page erase is prohibited and not executed, for example, as a reply to the specific command to the controller 11.

In this case, the controller 11 disposed outside the flash memory (chip) 10 interprets the reply to the specific command, and executes the refresh operation or corresponding operation as the occasion demands.

Moreover, the control circuit 15 mounted on the flash memory 10 may include a function of controlling not only the operation concerning the storage of the information associated with the number of data write/erase times of the page but also the operation of judging the refresh condition and concrete refresh operation as additionally described above.

As described above, the example of the present invention can be applied to any system which includes a nonvolatile semiconductor memory including the page erase function and controller for controlling the information associated with the number of data write/erase times.

Moreover, in the above-described embodiments, mainly the NAND-type flash memory has been described as the assumption, but the example of the present invention can also be applied to other nonvolatile semiconductor memories such as NOR-type, AND-type, and DINOR-type nonvolatile semiconductor memories. Furthermore, in addition to the flash memory, the nonvolatile semiconductor memory includes a magnetic random access memory (MRAM) in which a magnetic material has been used in the noted memory cell in recent years, ferroelectric random access memory (FeRAM) in which a ferroelectric material is used in the memory cell, ovonics unified memory (OUM) in which chalcogenide is used in the memory cell, and the like.

As described above, according to the example of the present invention, one portion in the block can be erased, a frequency at which the non-renewed data in the block is saved in another block during the data renew decreases, and great enhancement of the write capability can be expected.

As described above, according to the present invention, in the flash memory card in which the NAND-type flash memory including the page erase function is used, the number of data write/erase times of each page in the block is limited in a constant condition. Accordingly, the problem caused by the stress given to another non-selected page can be avoided by the page erase operation. Consequently, even when the data write/erase with a relatively small size frequently occurs, there can be provided the flash memory card in which the write capability is not deteriorated.

What is claimed is:

1. A method for controlling a nonvolatile semiconductor memory including a block which has a plurality of pages, the method comprising:
    sending a request for a write/erase operation by a page unit to the nonvolatile semiconductor memory; and
    managing, for each page, information associated with respective numbers of data write/erase times of the pages.

2. The method according to claim 1, further comprising:
    determining whether perform a refresh to return states of memory cells of all the pages in the block based on the information.

3. The method according to claim 2, wherein the refresh is executed, when a total value of the number of data write/erase times reaches a predetermined value with respect to all the pages.

4. The method according to claim 3, wherein the information is initialized by the refresh.

5. The method according to claim 2, wherein the refresh is executed, when a maximum value of the number of data write/erase times reaches a predetermined value with respect to all the pages.

6. The method according to claim 5, wherein the information is initialized by the refresh.

7. The method according to claim 2, wherein the refresh is executed, when a value obtained by subtracting a minimum value from a maximum value of the number of data write/erase times reaches a predetermined value with respect to all the pages.

8. The method according to claim 7, wherein the information is initialized by the refresh.

9. The method according to claim 1, wherein the information is managed in the nonvolatile semiconductor memory.

10. The method according to claim 1, wherein the information is managed out of the nonvolatile semiconductor memory.

11. A method for controlling a nonvolatile semiconductor memory including a block which has a plurality of areas, the method comprising:
    sending a request for a write/erase operation by an area unit to the nonvolatile semiconductor memory; and
    managing, for each area, information associated with respective numbers of data write/erase times of the areas.

12. The method according to claim 11, further comprising:
    determining whether perform a refresh to return states of memory cells of all the areas in the block based on the information.

13. The method according to claim 12, wherein the refresh is executed, when a total value of the number of data write/erase times reaches a predetermined value with respect to all the areas.

14. The method according to claim 13, wherein the information is initialized by the refresh.

15. The method according to claim 12, wherein the refresh is executed, when a maximum value of the number of data write/erase times reaches a predetermined value with respect to all the areas.

16. The method according to claim 15, wherein the information is initialized by the refresh.

17. The method according to claim 12, wherein the refresh is executed, when a value obtained by subtracting a minimum value from a maximum value of the number of data write/erase times reaches a predetermined value with respect to all the areas.

18. The method according to claim 17, wherein the information is initialized by the refresh.

19. The method according to claim 11, wherein the information is managed in the nonvolatile semiconductor memory.

20. The method according to claim 11, wherein the information is managed out of the nonvolatile semiconductor memory.

* * * * *